(12) United States Patent
Yablonskiy et al.

(10) Patent No.: US 10,215,821 B2
(45) Date of Patent: Feb. 26, 2019

(54) METHODS FOR SIMULTANEOUS MULTI-ANGULAR RELAXOMETRY AND RF MAPPING OF TISSUE USING MAGNETIC RESONANCE IMAGING

(71) Applicant: Washington University, St. Louis, MO (US)

(72) Inventors: Dmitriy A. Yablonskiy, St. Louis, MO (US); Alexander L. Sukstansky, St. Louis, MO (US); Jie Wen, St. Louis, MO (US); Anne H. Cross, St. Louis, MO (US)

(73) Assignee: Washington University, St. Louis, MO (US)

( * ) Notice: Subject to any disclaimer, the term of this patent is extended or adjusted under 35 U.S.C. 154(b) by 187 days.

(21) Appl. No.: 15/389,156

(22) Filed: Dec. 22, 2016

(65) Prior Publication Data

US 2017/0176563 A1 Jun. 22, 2017
US 2018/0017647 A9 Jan. 18, 2018

Related U.S. Application Data

(60) Provisional application No. 62/354,469, filed on Jun. 24, 2016, provisional application No. 62/271,165, filed on Dec. 22, 2015.

(51) Int. Cl.
*G01R 33/50* (2006.01)
*G01R 33/24* (2006.01)
*G01R 33/561* (2006.01)
*G01R 33/565* (2006.01)

(52) U.S. Cl.
CPC ........... *G01R 33/50* (2013.01); *G01R 33/246* (2013.01); *G01R 33/5616* (2013.01); *G01R 33/5659* (2013.01); *G01R 33/56563* (2013.01)

(58) Field of Classification Search
CPC .. G01R 33/246; G01R 33/60; G01R 33/5616; G01R 33/56563; G01R 33/5659
See application file for complete search history.

(56) References Cited

U.S. PATENT DOCUMENTS

| 8,278,925 | B2 | 10/2012 | Sun et al. | |
| 8,854,038 | B2 | 10/2014 | Hernando et al. | |
| 2011/0156704 | A1* | 6/2011 | Boernert | G01R 33/3415 324/309 |
| 2012/0268121 | A1 | 10/2012 | Hernando et al. | |
| 2013/0141096 | A1 | 6/2013 | Bottomley et al. | |
| 2014/0292330 | A1 | 10/2014 | Gulani et al. | |
| 2015/0015258 | A1* | 1/2015 | Fautz | G01R 33/246 324/309 |
| 2015/0073258 | A1 | 3/2015 | Mazer et al. | |

OTHER PUBLICATIONS

Akoka et al., "Radiofrequency Map of an NMR Coil by Imaging," Magnetic Resonance Imaging 11(3): 437-441 (1993).
(Continued)

*Primary Examiner* — Gregory H Curran
(74) *Attorney, Agent, or Firm* — Armstrong Teasdale LLP

(57) ABSTRACT

Methods of obtaining quantitative MRI images of a subject that includes fitting a theoretical model that accounts for tissue-specific relaxation properties and magnetization transfer effects to MRI measured data is disclosed.

18 Claims, 21 Drawing Sheets
(5 of 21 Drawing Sheet(s) Filed in Color)

(56) References Cited

OTHER PUBLICATIONS

Bashir et al., "Gradient Echo Plural Contrast Imaging (GEPCI)," Proceedings of the International Society of Magnetic Resonance in Medicine 14: 429 (2006).
Bernstein et al., "Reconstructions of phase-contrast, phased-array multicoil data," Magnetic Resonance in Medicine, 32(3): 330-334 (1994).
Bieri et al., "On the origin of apparent low tissue signals in balanced SSFP," Magnetic Resonance in Medicine, 56(5): 1067-1074 (2006).
Bloch et al., Magnetic Resonance for Nonrotating Fields, Physical Review Letters, 57(6): 522-527 (1940).
Bretthorst, GL "How accurately can parameters from exponential models be estimated? A Bayesian View," Concepts in Magnetic Resonance, 27A(2): 73-83 (2005).
Chang et al., "In vivo lung morphometry with accelerated hyperpolarized 3He diffusion MRI: A preliminary study," Magnetic Resonance in Medicine, 73(4): 1609-1614 (2015).
Chang, Y.V., "Rapid B1 mapping using orthogonal, equal-amplitude radio-frequency pulses," Magnetic Resonance in Medicine, 67(3): 718-723 (2012).
Christensen et al., "Optimal Determination of Relaxation-Times of Fourier-Transform Nuclear Magnetic-Resonance—Determination of Spin-Lattice Relaxation-Times in Chemically Polarized Species," J Physical Chemistry, 78(19): 1971-1977 (1974).
Conturo et al., "Signal-to-noise in phase angle reconstruction: dynamic range extension using phase reference offsets," Magnetic Resonance in Medicine, 15(3): 420-437 (1990).
Cunningham et al., "Saturated double-angle method for rapid B1+ mapping," Magnetic Resonance in Medicine, 55(6): 1326-1333 (2006).
Deoni et al., "High-resolution T1 and T2 mapping of the brain in a clinically acceptable time with DESPOT1 and DESPOT2," Magnetic Resonance in Medicine, 53(1): 237-241 (2005).
Deoni et al., "Rapid combined T1 and T2 mapping using gradient recalled acquisition in the steady state," Magnetic Resonance in Medicine, 49(3): 515-526 (2003).
Dortch et al., "Quantitative Magnetization Transfer Imaging in Human Brain at 3T via Selective Inversion Recovery," Magnetic Resonance in Medicine, 66(5): 1346-1352 (2011).
Dortch et al., "Quantitative Magnetization Transfer Imaging of Human Brian at 7T," NeuroImage, 64: 640-649 (2013).
Dowell et al., "Fast, accurate, and precise mapping of the RF field in vivo using the 180 degrees signal null," Magnetic Resonance in Medicine, 58(3): 622-630 (2007).
Du et al., "Measurement of T1 of the Ultrashort T2 Components in White Matter of the Brain at 3T," PLOS One, 9(8): e103296, 8 pages (2014).
Ernst et al., "Application of Fourier transform spectroscopy to magnetic resonance," Review of Scientific Instruments, 37: 93-102 (1966).
Ford et al., "Magnetic field distribution in models of trabecular bone," Magnetic Resonance in Medicine, 30(3): 373-379 (1993).
Fram et al., "Rapid Calculation of T1 Using Variable Flip Angle Gradient Refocused Imaging," Magnetic Resonance Imaging, 5(3): 201-208 (1987).
Frischer et al., "Clinical and pathological insights into the dynamic nature of the white matter multiple sclerosis plaque," Annals of Neurology, 78(5): 710-721 (2015).
"Gloor et al., ""Quantitative magnetization transfer imaging using balanced SSFP,"" Magnetic Resonance in Medicine, 60(3): 691-700 (2008)."
Graham et al., "Understanding pulsed magnetization transfer," Journal of Magnetic Resonance Imaging, 7(5): 903-912 (1997).
"Griswold et al., ""Generalized Autocalibrating Partially Parallel Acquisitions (GRAPPA),"" Magnetic Resonance inMedicine, 47(6): 1202-1210 (2002)."
Harkins et al., "In-vivo multi-exponential T2, magnetization transfer and quantitative histology in a rat model of intramyelinic edema," NeuroImage: Clinical 2: 810-817 (2013).
Henkelman et al., "Quantitative interpretation of magnetization transfer," Magnetic Resonance in Medicine, 29(6): 759-766 (1993).
Homer et al., "Conditions for the Driven Equilibrium Single Pulse Observation of Spin-Lattice Relaxation-Times," Journal of Magnetic Resonance, 74(3): 424-432 (1987).
Homer et al., "Driven-Equilibrium Single-Pulse Observation of T1 Relaxation—a Reevaluation of a Rapid New Method for Determining Nmr Spin-Lattice Relaxation-Times," Journal of Magnetic Resonance, 63(2): 287-297 (1985).
Homer et al., "Routine Evaluation of M0 Ratios and T1 Values from Driven-Equilibrium Nmr-Spectra," Journal of Magnetic Resonance, 89(2): 265-272 (1990).
Horch et al., "Origins of the ultrashort-T2 1H NMR signals in myelinated nerve: a direct measure of myelin content?" Magnetic Resonance in Medicine, 66(1): 24-31 (2011).
Hornak et al., "Magnetic Field Mapping," Magnetic Resonance in Medicine, 6(2): 158-163 (1988).
Insko et al., "Mapping of the Radiofrequency Field," Journal of Magnetic Resonance, Series A, 103(1): 82-85 (1993).
Jenkinson et al., "A global optimisation method for robust affine registration of brain images," Medical Image Analysis, 5(2): 143-156 (2001).
Jenkinson et al., "FSL," NeuroImage, 62(2): 782-790 (2012).
Jenkinson et al., "Improved optimization for the robust and accurate linear registration and motion correction of brain images," NeuroImage, 17(2): 825-841 (2002).
Jiru et al., "Fast 3D radiofrequency field mapping using echo-planar imaging," Magnetic Resonance in Medicine, 56(6): 1375-1379 (2006).
Katscher et al., "Transmit SENSE," Magnetic Resonance in Medicine, 49(1): 144-150 (2003).
Listerud, J. "Off-resonance pulsed magnetization transfer in clinical MR imaging: optimization by an analysis of transients," Magnetic Resonance in Medicine, 37(5): 693-705 (1997).
Liu et al., "Rapid multicomponent relaxometry in steady state with correction of magnetization transfer effects," Magnetic Resonance in Medicine, 75(4): 1423-1433 (Apr. 2016) (Published in Wiley Online Library 2015).
Luo et al., "Gradient echo magnetic resonance imaging correlates with clinical measures and allows visualization of veins within multiple sclerosis lesions," Multiple Sclerosis Journal, 20(3): 349-355 (2014).
Luo et al., "Gradient echo plural contrast imaging—signal model and derived contrasts: T2*, T1, phase, SWI, T1f, FST2*and T2*-SWI," NeuroImage, 60(2): 1073-1082 (2012).
McConnell, HM "Reaction Rates by Nuclear Magnetic Resonance," Journal of Chemical Physics, 28(3): 430-431 (1958).
Morrell, GR "A phase-sensitive method of flip angle mapping," Magnetic Resonance in Medicine, 60(4): 889-894 (2008).
Morrison et al., "A model for magnetization transfer in tissues," Magnetic Resonance in Medicine, 33(4): 475-482 (1995).
Mossahebi et al., "Analysis and Correction of Biases in Cross-Relaxation MRI due to Biexponential Longitudinal Relaxation," Magnetic Resonance in Medicine, 71(2): 830-838 (2014).
Mugler, 3rd et al., "Rapid three-dimensional T1-weighted MR imaging with the MPRAGE sequence," Journal of Magnetic Resonance Imaging, 1(5): 561-567 (1991).
Ogawa et al., "Brain magnetic resonance imaging with contrast dependent on blood oxygenation," Proceedings of the National Academy of Sciences (USA), 87(24): 868-9872 (1990).
Ogawa et al., "Functional brain mapping by blood oxygenation level-dependent contrast magnetic resonance imaging. A comparison of signal characteristics with a biophysical model," Biophys J, 64(3): 803-812 (1993).
Ou et al., "MT effects and T1 quantification in single-slice spoiled gradient echo imaging," Magnetic Resonance in Medicine, 59(4): 835-845 (2008).
Patel et al., "Detection of cortical lesions in multiple sclerosis: A new imaging approach," MSJ—Experimental, Translational and Clinical, 1: 1-4 (2015).
Pike, GB. "Pulsed magnetization transfer contrast in gradient echo imaging: a two-pool analytic description of signal response," Magnetic Resonance in Medicine, 36(1): 95-103 (1996).

(56) References Cited

OTHER PUBLICATIONS

Prantner et al., "Magnetization transfer induced biexponential longitudinal relaxation," Magnetic Resonance in Medicine, 60(3): 555-563 (2008).
Prineas et al., "Immunopathology of secondary-progressive multiple sclerosis," Annals of Neurology, 50(5): 646-657 (2001).
Quirk et al., ""Optimal decay rate constant estimates from phased array data utilizing joint Bayesian analysis,"" Journal of Magnetic Resonance, 198(1): 49-56 (2009).
Ropele et al., "Method for quantitative imaging of the macromolecular 1H fraction in tissues," Magnetic Resonance in Medicine, 49(5): 864-871 (2003).
Sacolick et al., "B1 mapping by Bloch-Siegert shift," Magenic Resonance in Medicine, 63(5): 1315-1322 (2010).
Sati et al., "In vivo quantitative evaluation of brain tissue damage in multiple sclerosis using gradient echo plural contrast imaging technique," NeuroImage, 51(3): 1089-1097 (2010).
Sati et al., "Micro-compartment specific T2* relaxation in the brain," NeuroImage, 77(0): 268-278 (2013).
Sled et al., "Quantitative imaging of magnetization transfer exchange and relaxation properties in vivo using MRI," Magnetic Resonance in Medicine, 46(5): 923-931 (2001).
Stanisz et al., "Characterizing white matter with magnetization transfer and T(2)," Magnetic Resonance in Medicine, 42(6): 1128-1136 (1999).
Stanisz et al., "T1, T2 relaxation and magnetization transfer in tissue at 3T," Magnetic Resonance in Medicine, 54(3): 507-512 (2005).
Stollberger et al., "Imaging of the active B1 field in vivo," Magnetic Resonance Medicine, 35(2): 246-251 (1996).
Sukstanskii et al., "How accurately can the parameters from a model of anisotropic (3)He gas diffusion in lung acinar airways be estimated? Bayesian view," Journal of Magnetic Resonance, 184(1): 62-71 (2007).
Sukstanskii et al., "Simultaneous multi-angular relaxometry of tissue with MRI (SMART MRI): Theoretical background and proof of concept," Magnetic Resonance in Medicine, 77(3): 1296-1306 (2016).
Tessier et al., "Interpretation of magnetization transfer and proton cross-relaxation spectra of biological tissues," Journal of Magnetic Resonance, Series B, 107(2): 138-144 (1995).
Tozer et al., "Quantitative magnetization transfer mapping of bound protons in multiple sclerosis," Magnetic Resonance in Medicine, 50(1): 83-91 (2003).
Ulrich et al., "Separation of cellular and Bold contributions to T2* signal relaxation," Magnetic Resonance in Medicine, 75(2): 606-615 (Feb. 2016).
Wang et al., "Optimizing the Precision in T1 Relaxation Estimation Using Limited Flip Angles," Magnetic Resonance in Medicine, 5(5): 399-416 (1987).
Wansapura et al., "NMR relaxation times in the human brain at 3.0 tesla," Journal of Magnetic Resonance Imaging, 9(4): 531-538 (1999).
Wen et al., "Detection and quantification of regional cortical gray matter damage in multiple sclerosis utilizing gradient echo MRI," NeuroImage: Clinical 9: 164-175 (2015).
Wen et al., "On the role of physiological fluctuations in quantitative gradient echo MRI: implications for GEPCI, QSM, and SWI," Magnetic Resonance in Medicine, 73: 195-203 (2015).
Wharton et al., "Fiber orientation-dependent white matter contrast in gradient echo MRI," Proceedings of the National Academy of Science, USA 109(45): 18559-18564 (2012).
Wolff et al., "Magnetization transfer contrast (MTC) and tissue water proton relaxation in vivo," Magnetic Resonance in Medicine, 10(1): 135-144 (1989).
Xu et al., "Designing multichannel, multidimensional, arbitrary flip angle RF pulses using an optimal control approach," Magnetic Resonance in Medicine, 59(3): 547-560 (2008).
Yablonskiy DA. "Quantitation of intrinsic magnetic susceptibility-related effects in a tissue matrix. Phantom study," Magnetic Resonance in Medicine, 39(3): 417-428 (1998).
Yablonskiy et al., Biophysical mechanisms of MRI signal frequency contrast in multiple sclerosis. PNAS, 109(35): 14212-14217 (2009).
Yablonskiy et al., "Blood oxygenation level-dependent (BOLD)-based techniques for the quantification of brain hemodynamic and metabolic properties—theoretical models and experimental approaches," NMR in Biomedicine, 26(8): 963-986 (2013).
Yablonskiy et al., "Theory of NMR signal behavior in magnetically inhomogeneous tissues: the static dephasing regime," Magnetic Resonance in Medicine, 32(6): 749-763 (1994).
Yablonskiy et al., "Voxel spread function (VSF) method for correction of magnetic field inhomogeneity effects in quantitative gradient-echo-based MRI," Magnetic Resonance in Medicine 70(5): 1283-1292 (2013).
Yarnykh et al., "Cross-relaxation imaging reveals detailed anatomy of white matter fiber tracts in the human brain," NeuroImage, 23(1): 409-424 (2004).
Yarnykh et al., "Macromolecular Proton Fraction (MPF) and Magnetization Transfer Ratio (MTR) in Normal-Appearing Brain Tissues as Imaging Biomarkers in Multiple Sclerosis (MS)," Annals of Neurology, 76: S111-S111 (2014).
Yarnykh, VL "Actual flip-angle imaging in the pulsed steady state: A method for rapid three-dimensional mapping of the transmitted radiofrequency field," Magnetic Resonance in Medicine 57(1): 192-200 (2007).
Yarnykh, VL "Fast macromolecular proton fraction mapping from a single off-resonance magnetization transfer measurement," Magnetic Resonance in Medicine, 68(1): 166-178 (2012).
Yarnykh, VL "Pulsed Z-spectroscopic imaging of cross-relaxation parameters in tissues for human MRI: theory and alinical applications," Magnetic Resonance in Medicine, 47(5): 929-939 (2002).
Zaiss et al., "A combined analytical solution for chemical exchange saturation transfer and semi-solid magnetization transfer," NMR in Biomedicine, 28(2): 217-230 (2015).
Zhang et al., "Segmentation of brain MR images through a hidden Markov random field model and the expectation-maximization algorithm," IEEE Transactions on Medical Imaginag, 20(1): 45-57 (2001).
Zhu, Y. "Parallel excitation with an array of transmit coils," Magnetic Resonance in Medicine, 51(4): 775-784 (2004).

\* cited by examiner

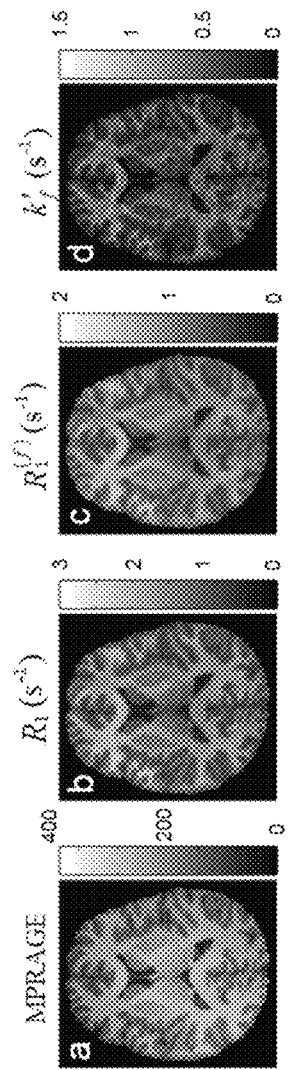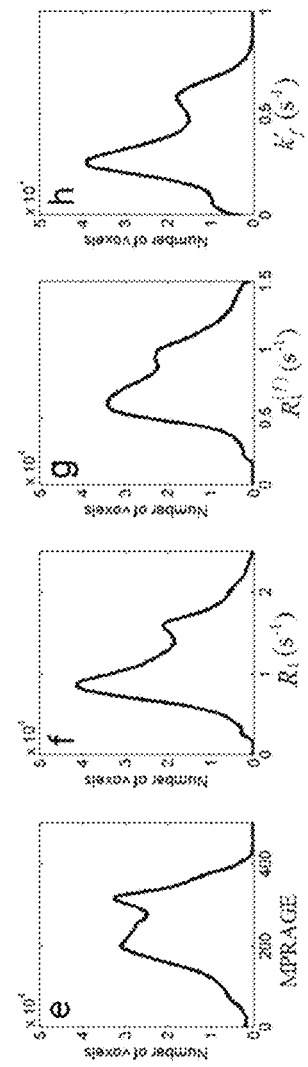
FIG. 6A FIG. 6B FIG. 6C FIG. 6D
FIG. 6E FIG. 6F FIG. 6G FIG. 6H

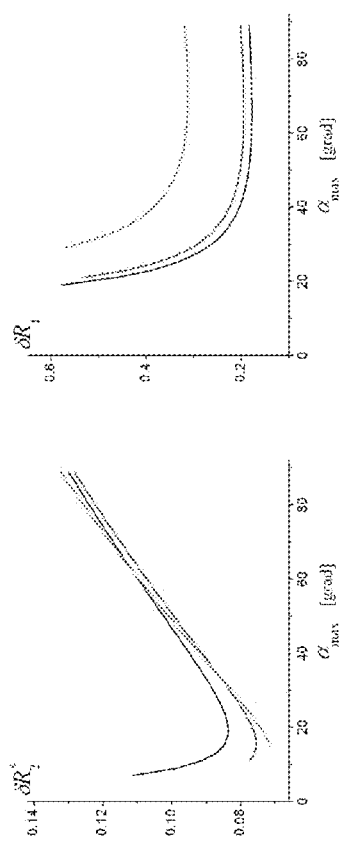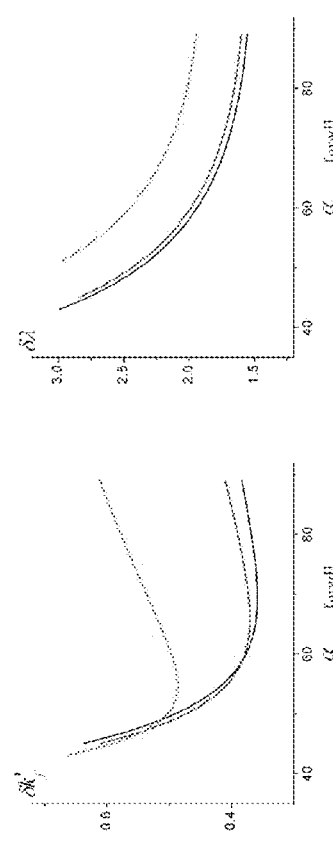
FIG.12A  FIG.12B  FIG.12C  FIG.12D

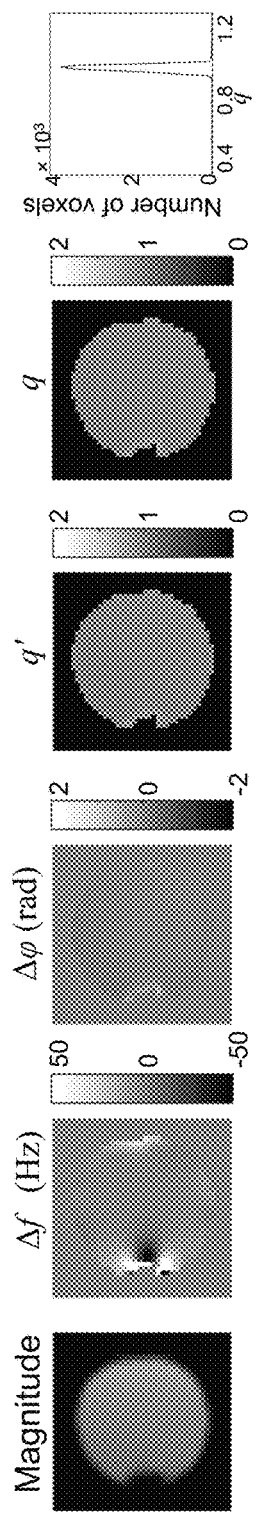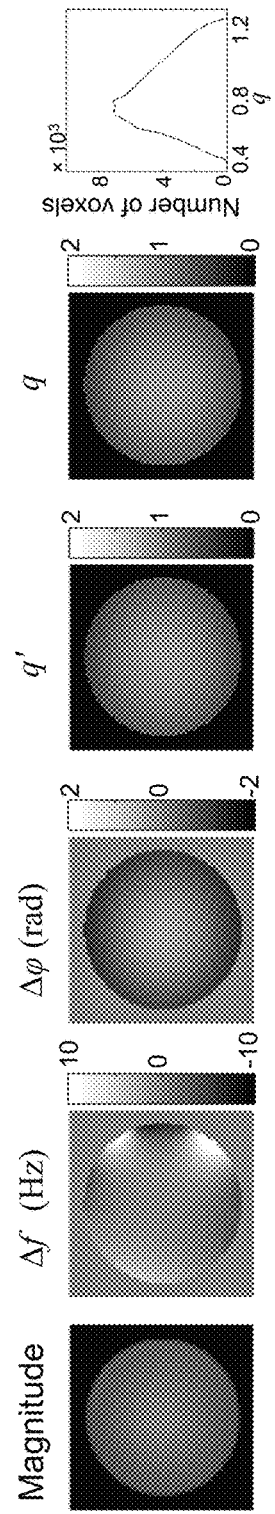

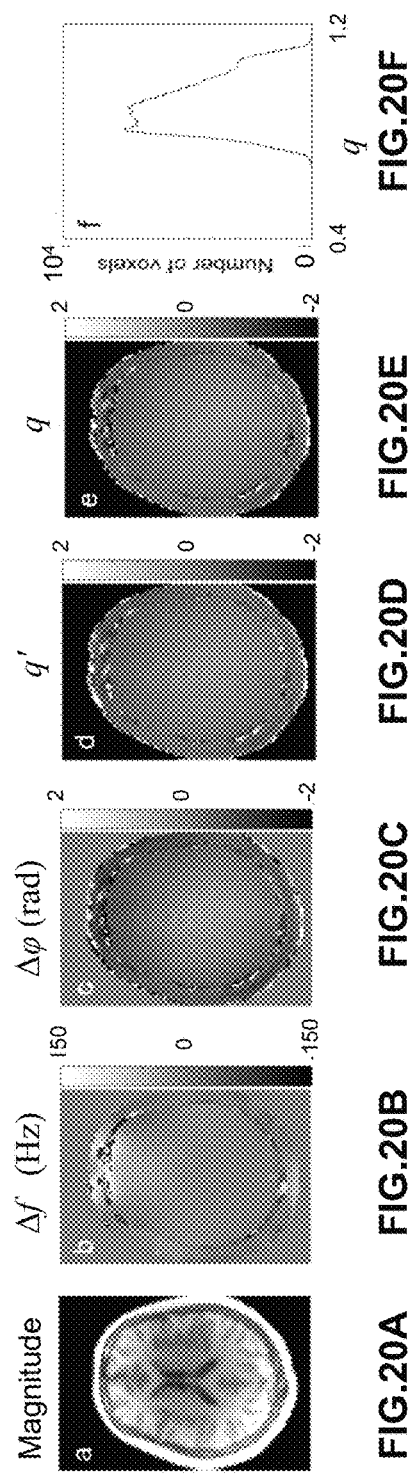

METHODS FOR SIMULTANEOUS MULTI-ANGULAR RELAXOMETRY AND RF MAPPING OF TISSUE USING MAGNETIC RESONANCE IMAGING

CROSS REFERENCE TO RELATED APPLICATIONS

This application claims the benefit of U.S. Provisional Patent Application Ser. No. 62/354,469 entitled "ROBUST MODEL-INDEPENDENT B1 MAPPING WITH PHASED-ARRAY RF COILS: A MULTI-GRADIENT-ECHO APPROACH WITH ORTHOGONAL EXCITATION RF PULSES AND B0 CORRECTION" filed on Jun. 24, 2016, the entirety of which is hereby incorporated by reference. This application also claims the benefit of U.S. Provisional Patent Application Ser. No. 62/271,165 entitled "METHODS FOR SIMULTANEOUS MULTI-ANGULAR RELAXOMETRY OF TISSUE USING MAGNETIC RESONANCE IMAGING" filed on Dec. 22, 2015, the entirety of which is hereby incorporated by reference.

FIELD OF THE INVENTION

This disclosure relates to methods of MRI imaging of biological tissues. In particular, this disclosure relates to methods of obtaining quantitative MRI images of tissue-specific parameters describing relaxation properties and magnetization transfer effects, by fitting a theoretical model that accounts for these tissue-specific parameters, to MRI measured data.

BACKGROUND

Quantitative measurements of relaxation parameters characterizing MRI signal, such as longitudinal ($R_1$), transverse ($R_2$ and $R_2^*$) and cross-relaxation rate constants have always been an important task in the field of quantitative MRI. Conventional inversion recovery (IR) and spin echo (SE) sequences have been used as the gold standard to measure $R_1$ and $R_2$, respectively. However, the long acquisition times have greatly hindered their clinical applications.

Compared to conventional IR techniques, variable flip angle (VFA) $R_1$ mapping is based on imaging in steady state and can greatly reduce scan time, thus making 3D high-resolution $R_1$ mapping of the whole brain feasible. Information on cross-relaxation parameters is usually obtained using off-resonance magnetization transfer (MT) saturation pulses. It was also realized that MT effects can greatly affect gradient echo signals, even in the absence of off-resonance MT saturation pulses thus causing systematic errors in VFA measurements.

Recently, a Gradient Echo Plural Contrast Imaging (GEPCI) technique based on a Gradient Recalled Echo (GRE) sequence with multiple gradient echoes has enabled simultaneous generation of naturally co-registered multi-contrast images ($T_1$-weighted or spin density images, $R_2^*$ maps and frequency maps) from a single MR scan. $R_2^*$ mapping using GRE sequences has many advantages. First, the acquisition is fast, and therefore suffers from fewer motion artifacts. Second, due to the low flip angle used in GRE sequences, they have lower RF power deposition and are more suitable for high-field MRI. GRE sequences may also be sensitive to tissue-specific magnetic susceptibility effects, and hence may provide separate information on tissue cellular and hemodynamic properties.

Different methods have been used in the past to map the B1 field. The magnitude-based methods strongly rely on specific theoretical models that fail to account for complexity of biological tissues. As a result, previous methods are subject to biases and errors due to the limitations of the models imperfections and usually require a low-pass filter to eliminate noise in the data. To minimize this effect, long repetition times to suppress the $T_1$ dependence of the signal can be used but demand very long acquisition times. The phase-based approaches are less dependent on a model than amplitude-based methods.

SUMMARY

In one aspect, a method of performing quantitative MRI imaging of a subject is disclosed. The method includes acquiring a plurality of MR data using an RF coil from the subject using a GRE sequence with a series of read-out gradient pulses with a plurality of flip angles. The method also includes combining a plurality of MRI image datasets obtained from the subject to form a single dataset. Each MRI image dataset includes a plurality of imaging voxels and an image value set associated with each imaging voxel. Each image value set includes multiple image values, and each image value is reconstructed from k-space MRI data obtained from one RF channel of the RF coil at one combination of read-out gradient pulse and flip angle of the GRE sequence. The method also includes fitting a theoretical model $S(\alpha, TR, TE)$ to each image value set associated with each imaging voxel of the single dataset. The theoretical model $S(\alpha, TR, TE)$ is characterized by five quantitative tissue-specific MRI parameters. The quantitative tissue-specific MRI parameters include: $S_0$ representing a spin density, $R_1$ representing a longitudinal relaxation rate constant, $R_2^*$ representing a transverse relaxation rate constant, $k_f'$ representing a cross-relaxation rate constant, and $\lambda$ representing a magnetization transfer-related relaxation parameter. In addition, $\alpha$ is a flip angle, TR is a repetition time, and TE is a gradient echo time of the GRE sequence. The method further includes producing at least one quantitative image (map) that includes each imaging voxel and at least one corresponding value of $S_0$, $R_1$, $R_2^*$, $k_f'$, and $\lambda$ determined from fitting the theoretical model $S(\alpha, TR, TE)$.

In another aspect, a method of mapping a B1 radio-frequency field within a region of interest of an MRI scanning device is disclosed. The method includes obtaining a first plurality of MR signals produced in response to a first pair of successive and orthogonal excitation RF pulses that include a first initial excitation RF pulse with a first initial flip angle $\alpha$, as well as a first final excitation RF pulse produced orthogonal to the first initial excitation RF pulse with a first final flip angle $\beta$. The method also includes obtaining a second plurality of MR signals produced in response to a second pair of successive and orthogonal excitation RF pulses that include a second initial excitation RF pulse with a second initial flip angle $\alpha$ as well as a second final excitation RF pulse produced orthogonal to the second initial excitation RF pulse excitation with a second final flip angle $-\beta$. The method also includes analyzing the first and second plurality of MR signals to obtain a map of a B1-encoded MR signal phase and a B0-dependent signal frequency.

In an additional aspect, a method of performing quantitative MRI imaging of a subject is disclosed. The method includes acquiring a plurality of MR data using an RF coil from the subject using a GRE sequence with a series of read-out gradient pulses with a plurality of flip angles. The method also includes combining a plurality of MRI image datasets obtained from the subject to form a single dataset. Each MRI image dataset includes a plurality of imaging voxels and an image value set associated with each imaging voxel. Each image value set includes multiple image values, and each image value is reconstructed from k-space MRI data obtained from one RF channel of the RF coil at one combination of read-out gradient pulse and flip angle of the GRE sequence. The method also includes fitting a theoretical model $S(\alpha, TR, TE)$ to each image value set associated with each imaging voxel of the single dataset. The theoretical model $S(\alpha, TR, TE)$ is characterized by five quantitative tissue-specific MRI parameters. The quantitative tissue-specific MRI parameters include: $S_0$ representing a spin density, $R_1$ representing a longitudinal relaxation rate constant, $R_2^*$ representing a transverse relaxation rate constant, $k_f'$ representing a cross-relaxation rate constant, and $\lambda$ representing a magnetization transfer-related relaxation parameter, as well as an additional parameter q representing inhomogeneities in a B1 radio frequency transmitter field. In addition, $\alpha$ is a flip angle, TR is a repetition time, and TE is a gradient echo time of the GRE sequence. The method further includes producing at least one quantitative image (map) that includes each imaging voxel and at least one corresponding value of $S_0$, $R_1$, $R_2^*$, $k_f'$, and $\lambda$ determined from fitting the theoretical model $S(\alpha, TR, TE)$.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 6A is an MPRAGE image from a healthy subject.

FIG. 6B is a SMART MRI map of $R_1$ from a healthy subject.

FIG. 6C is a SMART MRI map of $R_1^{(f)}$ from a healthy subject.

FIG. 6D is a SMART MRI map of $k_f'$ from a healthy subject.

FIG. 6E is a graph containing a histogram of the MPRAGE signals from the image of FIG. 6A.

FIG. 6F is a graph containing a histogram of $R_1$ signals from the map of FIG. 6B.

FIG. 6G is a graph containing a histogram of the $R_1^{(f)}$ signals from the map of FIG. 6C.

FIG. 6H is a graph containing a histogram of the $k_f'$ signals from the map of FIG. 6D.

FIG. 12A is a graph of the uncertainty per unit measurement of $R_2^*$ ($\delta R_2^*$) as a function of maximal flip angle ($\alpha_{max}$) for different minimal flip angles $\alpha_{max}$=1°, 5°, 9° (black, red, and green lines, respectively), obtained using a 2° flip angle interval, TR=18 ms, and three gradient echoes (TE=2, 6, and 10 ms).

FIG. 12B is a graph of the uncertainty per unit measurement of $R_1$ ($\delta R_1$) as a function of maximal flip angle ($\alpha_{max}$) for different minimal flip angles $\alpha_{min}$=1°, 5°, 9° (black, red, and green lines, respectively), obtained using a 2° flip angle interval, TR=18 ms, and three gradient echoes (TE=2, 6, and 10 ms).

FIG. 12C is a graph of the uncertainty per unit measurement of $k_f'$ ($\delta k_f'$) as a function of maximal flip angle ($\alpha_{max}$) for different minimal flip angles $\alpha_{min}$=1°, 5°, 9° (black, red, and green lines, respectively), obtained using a 2° flip angle interval, TR=18 ms, and three gradient echoes (TE=2, 6, and 10 ms).

FIG. 12D is a graph of the uncertainty per unit measurement of $\lambda$ ($\delta\lambda$) as a function of maximal flip angle ($\alpha_{max}$) for different minimal flip angles $\alpha_{min}$=1°, 5°, 9° (black, red, and green lines, respectively), obtained using a 2° flip angle interval, TR=18 ms, and three gradient echoes (TE=2, 6, and 10 ms).

FIG. 19A is a magnitude image obtained using B1 mapping of a small spherical phantom.

FIG. 19B is a map of the frequency offset (Δf) due to B0 field inhomogeneities obtained using B1 mapping of a small spherical phantom.

FIG. 19C is a map of the phase difference Δφ between the two scans ((X, Y) and (X, −Y)) obtained using B1 mapping of a small spherical phantom.

FIG. 19D is a map of the parameter q' describing B1 field inhomogeneities, calculated with Δf=0 obtained using B1 mapping of a small spherical phantom.

FIG. 19E is a map of the parameter q calculated with Δf from the map of FIG. 19B.

FIG. 19F is a graph showing histograms of the parameters q and q' from FIG. 19D and FIG. 19E, respectively; the histograms are undistinguishable from one another.

FIG. 19G is a magnitude image obtained using B1 mapping of a large spherical phantom.

FIG. 19H is a map of the frequency offset (Δf) due to B0 field inhomogeneities obtained using B1 mapping of a large spherical phantom.

FIG. 19I is a map of the phase difference Δφ between the two scans ((X, Y) and (X, −Y)) obtained using B1 mapping of a large spherical phantom.

FIG. 19J is a map of the parameter q' describing B1 field inhomogeneities, calculated with Δf=0 obtained using B1 mapping of a large spherical phantom.

FIG. 19K is a map of the parameter q calculated with Δf from the map of FIG. 19H.

FIG. 19L is a graph showing histograms of the parameters q and q' from FIG. 19J and FIG. 19K, respectively; the histograms are undistinguishable from one another.

FIG. 20A is a magnitude image obtained using B1 mapping of a healthy volunteer.

FIG. 20B is a map of the frequency offset (Δf) due to B0 field inhomogeneities obtained using B1 mapping of a healthy volunteer.

FIG. 20C is a map of the phase difference Δφ between the two scans ((X, Y) and (X, −Y)) obtained using B1 mapping of a healthy volunteer.

FIG. 20D is a map of the parameter q' describing B1 field inhomogeneities, calculated with Δf=0 obtained using B1 mapping of a healthy volunteer.

FIG. 20E is a map of the parameter q calculated with Δf from the map of FIG. 20B.

FIG. 20F is a graph showing histograms of the parameters q and q' from FIG. 20D and FIG. 20E, respectively; the histograms are undistinguishable from one another.

Corresponding reference characters and labels indicate corresponding elements among the views of the drawings. The headings used in the figures should not be interpreted to limit the scope of the claims.

Figure 1:
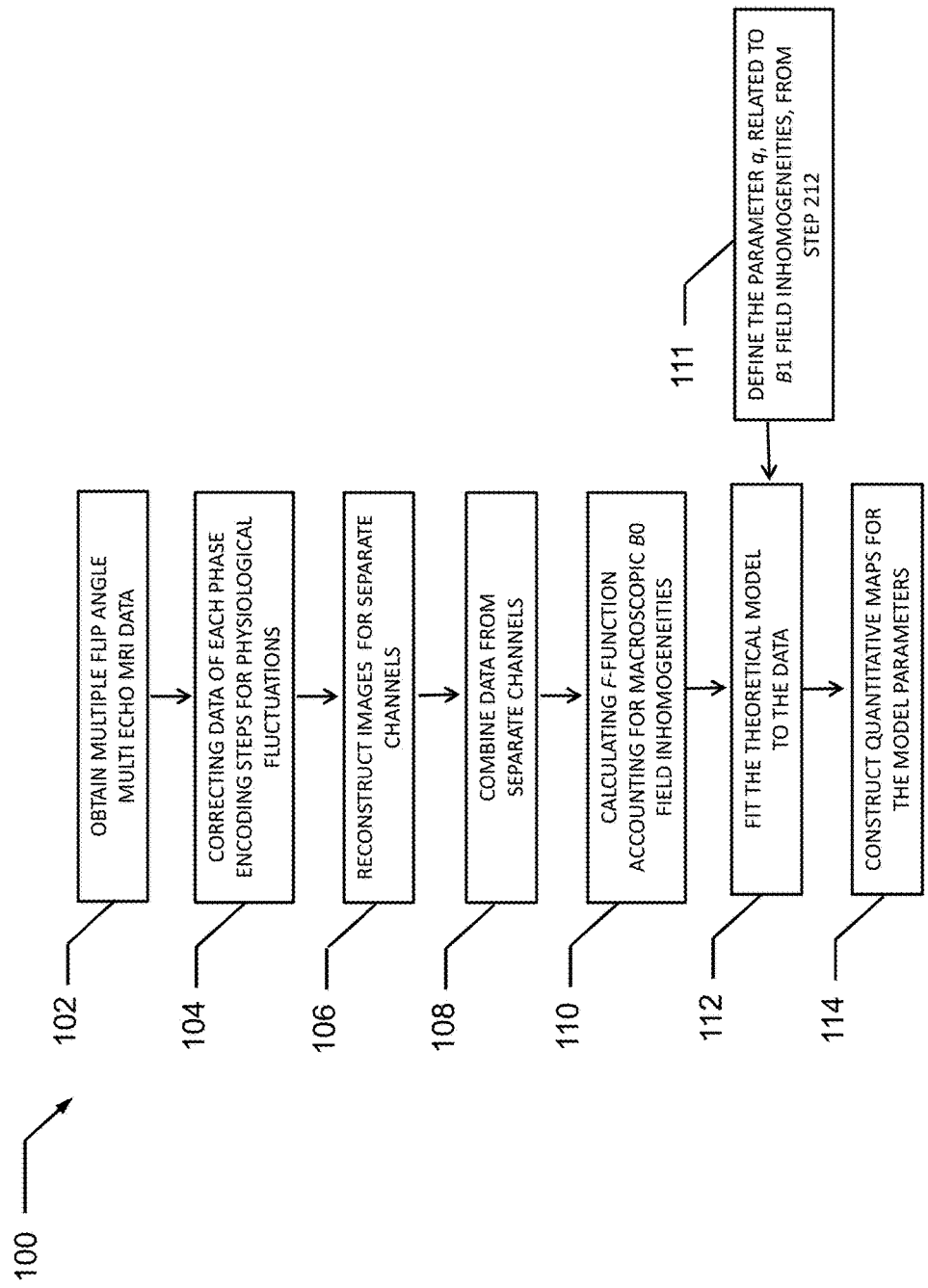
FIG. 1 is a flow chart illustrating a SMART MRI quantitative MRI imaging method according to one aspect.

Aspects of the invention may be better understood by referring to the following description in conjunction with the accompanying drawings.

DETAILED DESCRIPTION

While the making and using of various embodiments of the invention are discussed in detail below, it should be appreciated that the presently described embodiments provide many applicable inventive concepts that may be embodied in a wide variety of contexts. The specific embodiments discussed herein are merely illustrative of exemplary ways to make and use embodiments of the invention and do not delimit the scope of the invention.

To facilitate the understanding of this invention, a number of terms are defined below. Terms defined herein have meanings as commonly understood by a person of ordinary skill in the areas relevant to the embodiments of the invention. Terms such as "a," "an" and "the" are not intended to refer to only a singular entity, but include the general class of which a specific example may be used for illustration and are intended to mean that there are one or more of the elements. The terminology herein is used to describe specific embodiments of the invention, but their usage does not delimit the invention, except as outlined in the claims. The terms "comprising," "including," and "having" are intended to be inclusive and mean that there may be additional elements other than the listed elements.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

The terminology herein is used to describe embodiments of the invention, but their usage does not delimit the invention.

All numerical results, calculated for specific sets of parameters and displayed in the graphs included herein for illustrative purpose only and do not restrict or limit implications of the methods for other set of parameters unless otherwise is clearly stated.

In one aspect, a technique of providing quantitative measurements of tissue-specific spin density, relaxation and cross-relaxation parameters is disclosed. Typically, the measurements used to obtain tissue-specific relaxation and cross-relaxation parameters may include uncertainties due to artifacts created by inhomogeneities of macroscopic (B0) and radio-frequency (B1) fields, as well as the effects of physiological fluctuations and MRI system instabilities. In an aspect, a method for correction of artifacts related to B1 inhomogeneity effects is disclosed herein below. The method in this aspect not only enables the accurate measurement of B1 Radio-Frequency (RF) fields, but further provides additional capabilities for other MRI applications, such as RF pulse design.

In one aspect, a phase-sensitive approach for B1 mapping that relies on a multi-gradient-echo sequence with two successive orthogonal RF pulses is disclosed. In another aspect, a theoretical expression relating the MR signal phase to the B1 and B0 fields is disclosed that enables B1 evaluation based on measured MR signal phase and frequency. In an additional aspect, a theoretical analysis is disclosed that enables the selection of MR sequence parameters based on minimization of the B1 measurement error. In another additional aspect, a method for combining multi-channel data for optimal parameters estimation is disclosed.

Provided herein is a technique, SMART MRI, which provides quantitative maps of naturally co-registered tissue MRI parameters: spin density, longitudinal ($R_1$) and transverse ($R_2^*$) relaxation rate constants as well as essential parameters characterizing MT (magnetization transfer) effects within a single MRI experiment. Acquiring GRE data with multiple gradient echoes and multiple flip angles and accounting for cross-relaxation effects between "free" (intra- and extra-cellular) and "bound" (attached to macromolecules) water enables quantitative mapping of not only tissue $R_2^*$ relaxation rate but also tissue spin density, $R_1$ relaxation rate and some essential MT effects. The SMART MRI method disclosed herein may be used in various clinical applications including, but not limited to, obtaining comparative data from healthy subjects and patients afflicted with various disorders including, but not limited to, multiple sclerosis (MS), traumatic brain injury, Alzheimer disease, psychiatric disorders, and other disorders.

An accurate determination of $R_1$, $R_2^*$ and MT relaxation rate parameters has always been an important task in the field of quantitative MRI as these parameters may be used as biomarkers characterizing "health status" of biological tissues. Without being limited to any particular theory, it is thought that MT exchange effect between "free" water protons and "bound" water protons (cross-relaxation) can greatly affect the results of $R_1$ mapping, even in the absence of off-resonance MT saturation pulse, thus making $R_1$ mapping sequence dependent.

To address this effect, the SMART MRI method disclosed herein makes use of a theoretical model that accounts for cross-relaxation effects and provides quantitative expressions describing the dependence of the GRE signal on tissue parameters characterizing free water spin density $S_0$ and internal relaxation rate $R_1^{(f)}$. This model also provides information on other parameters characterizing cross-relaxation effects, thus allowing MT imaging without MT pulses.

This theoretical model, combined with the GRE sequence with multiple gradient echoes and multiple flip angles, may be used to simultaneously map multiple relaxation parameters describing free water and its interaction with bound water (i.e., water bounded to macromolecules). This approach generalizes an existing GEPCI approach, thereby enabling simultaneous generation of $R_2^*$ maps and $T_1$-weighted images. SMART MRI enables quantitative mapping of $R_2^*$, $T_1=1/R_1$ (instead of $T_1$-weighted), tissue density $S_0$, local frequency shift $\Delta\omega$, free water relaxation rate $R_1^{(f)}$, and additional parameters characterizing cross-relaxation MT effects including, but not limited to, $k'_f$ and $\lambda$ (defined in the Summary and Eq. [3] below).

Without being limited to any particular theory, the accuracy of measurements of relaxation parameters may be influenced by B1 (RF) field inhomogeneities. In one aspect, a phase-based B1 mapping method is disclosed that enables fast, accurate B1 mapping using a multi-channel phased-array coils. This method was used to perform measurements on two spherical phantoms of different sizes and on a human subject as described in the examples provided herein below. In addition, accurate quantification of human brain tissue relaxation and magnetization transfer parameters using the disclosed SMART MRI technique was also demonstrated in the examples provided herein below.

I. SMART MRI Quantitative MRI Imaging Method

In various aspects, a SMART MRI quantitative imaging method analyzes GRE (Gradient Recalled Echo) data with multiple gradient echoes and multiple flip angles obtained using widely available MRI scanning devices to simultaneously obtain naturally co-registered maps of spin density ($S_0$), longitudinal ($R_1$) and transverse ($R_2^*$) relaxation rate constants, as well as MT (magnetization transfer) related relaxation parameters ($k'_f$ and $\lambda$). The SMART MRI method enables high quality quantitative imaging data to be acquired in a relatively brief scan time without need for specialized MRI scanning equipment. By way of non-limiting example, high resolution (1×1×1 mm$^3$) data covering the whole brain and upper spinal cord of a human subject may be acquired within 18 minutes using a standard clinical 3 T scanner. The SMART MRI method may be used to image healthy brains and brains of patients with brain disorders, such as MS, to detect and evaluate brain damage in patients with brain disorders by means of multiple quantitative relaxometric maps, thereby enhancing the available diagnostic tools available to a clinician. By way of non-limiting example, all relaxation parameters determined using the SMART MRI method are typically characterized by lower parameter values in normal-appearing white and gray matter of MS subjects compared to healthy controls and thus enable effective contrast of MS lesions, including in the cerebellum of MS patients. Other diseases may be characterized by parameters values that are increased relative to corresponding parameter values of healthy controls.

In some aspects, Tissue Damage Score (TDS) maps, based on quantitative relaxometric parameters produced by SMART MRI, can be created using the SMART MRI method disclosed herein. Tissue Damage Score (TDS) maps may highlight details in the structure of WM lesions in MS patients, and may further reveal heterogeneity within WM lesions such as ring structures within some lesions. This ring structure likely reflects known pathologic features of some MS lesions, where the center is often less cellular and inactive, but with disease activity at the periphery. Thus, SMART MRI provides noninvasive insights into the dynamic pathology within some lesions.

FIG. 1 is a flow chart illustrating the SMART-MRI method 100 in one aspect. Referring to FIG. 1, the method 100 includes obtaining GRE data with multiple gradient echoes and multiple flip angles at step 102. Any suitable MRI scanner capable of performing GRE imaging may be used to obtain the GRE data at step 102. Non-limiting examples of suitable MRI scanners include closed MRI scanners, open MRI scanners, sitting MRI scanners, and standing MRI scanners. In addition, suitable MRI scanners may have any magnet field strength including, but not limited to a magnetic field strength from about 0.5 Tesla (T) to about 3 T or higher. By way of non-limiting example, a 3 T Trio MRI scanner (Siemens, Erlangen, Germany) equipped with a 32-channel phased-array head coil may be used to obtain GRE data at step 102.

The GRE data may be acquired at step 102 using a multi-slice two dimensional (2D) or a three dimensional (3D) multi-gradient-echo sequence with at least two flip angles. In various aspects, a variety of flip angles, gradient echo times and GRE sequence repetition times can be used to perform SMART MRI. Since a fitting routine is used to determine relaxometry parameters, the number of measurements should be bigger than the number of measured parameters. In various embodiments, the GRE data may be acquired at step 102 using a three dimensional (3D) multi-gradient-echo sequence with at least three flip angles, at least four flip angles, at least five flip angles, at least six flip angles, at least seven flip angles, at least eight flip angles, at least nine flip angles, and at least ten flip angles. The flip angles may range from about 1° to about 180° in various aspects. In one exemplary aspect, the GRE data may be acquired at step 102 using a three dimensional (3D) multi-gradient-echo sequence with five flip angles of 5°, 10°, 20°, 40° and 60°.

Figure 3:
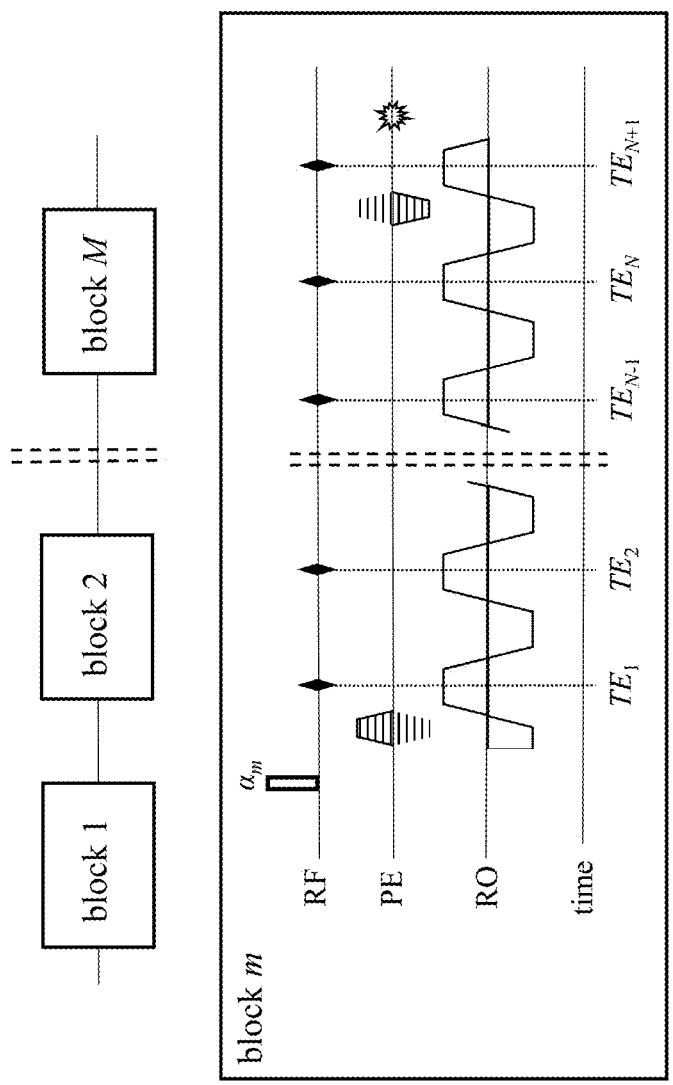
FIG. 3 is a schematic block diagram of a MR pulse sequence corresponding to the consecutive data acquisition.

In one aspect, the MR pulse sequence may enable consecutive data acquisition, as illustrated schematically in FIG. 3. Referring to FIG. 3, MR data are collected separately for each flip angle and the $m^{th}$ block corresponds to a flip angle $\alpha_m$ (m=1, 2, . . . M). The first row in FIG. 3 shows a position of the RF pulse (rectangle) and positions of picked-up signals (rhombi). The second row displays the position of phase encoding gradients (the first trapezoid with horizontal lines), phase-compensated gradients (the second trapezoid), and the crasher gradient (star). The phase encoding gradients serve to encode images for 2D or 3D acquisition. The third row shows a profile of read-out gradients. The last, $(N+1)^{th}$, signal (phase-stabilization signal) is acquired after applying the phase-compensated gradient and serves to correct images for physiological fluctuations. The fourth line shows the echo times around which the signals are acquired: $TE_1$, $TE_2$, ... $TE_N$, $TE_{N+1}$.

Figure 4:
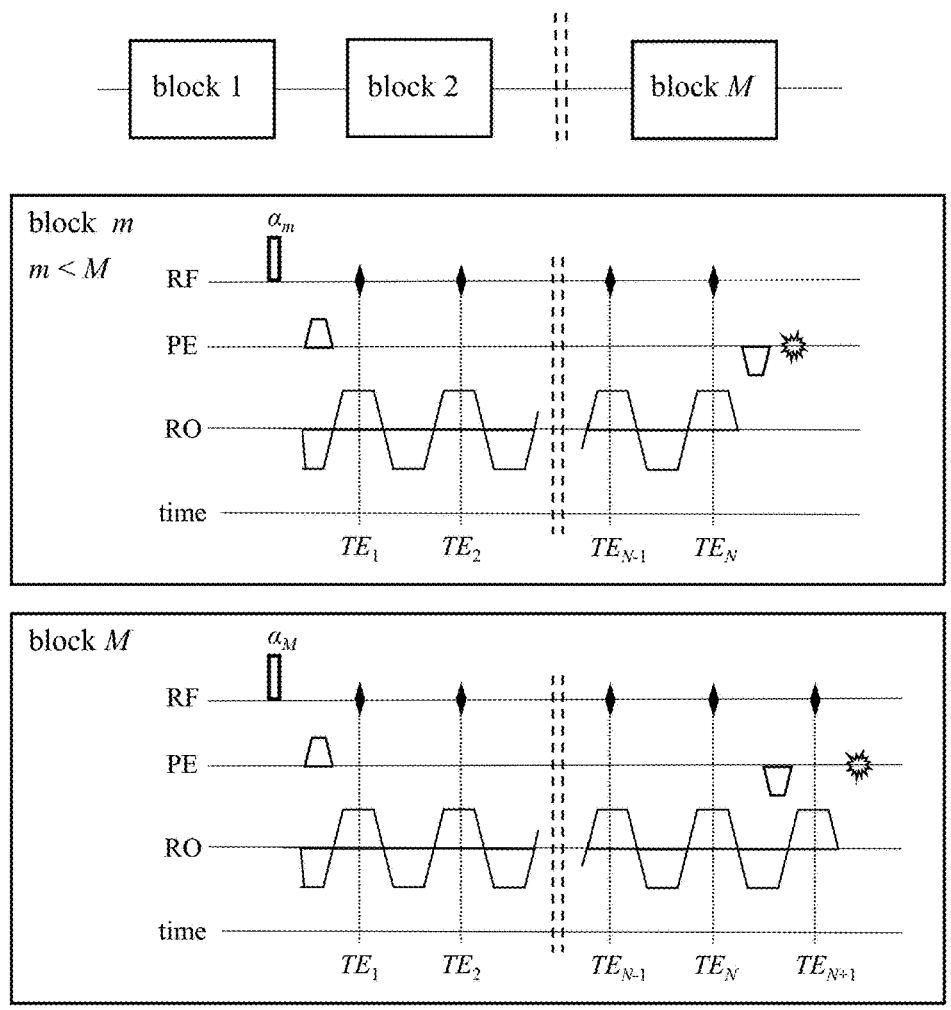
FIG. 4 is a schematic block diagram of a MR pulse sequence corresponding to the interleaved data acquisition.

In another aspect, the MR pulse sequence may enable interleaved data acquisition, as illustrated schematically in FIG. 4. As illustrated in FIG. 4, MR data are collected separately for each line of phase-encoding and phase-compensated gradients and then combined in the whole data set. The $m^{th}$ block corresponding to a flip angle $\alpha_m$ (m=1, 2, ... M). The first row shows a position of the RF pulse (rectangle) and positions of picked-up signals (rhombi). The second row displays the position of phase encoding gradients (shown as a line within the first trapezoid with horizontal lines), phase-compensated gradients (shown as a line within the second trapezoid), and the crasher gradient (star). The third row shows a profile of read-out gradients. The structure of the last, $M^{th}$, block differs from the others: the first M−1 blocks do not contain the phase-stabilization signal acquisition (at $TE_{N+1}$). Only the last ($M^{th}$) block contains the phase-stabilization signal acquisition after applying the phase-compensated gradient. The fourth line shows the moments (echo times) at which the signal are acquired: $TE_1$, $TE_2$, ... $TE_N$, $TE_{N+1}$. This MR pulse sequence illustrated in FIG. 4 allows faster acquisition because it uses only one phase-stabilization readout for all flip angles.

In various aspects, the GRE data acquired at step 102 can be under-sampled k space data. In this case, a full k-space data should be reconstructed prior to further analysis by different methods including, but not limited to, a Generalized Autocalibrating Partially Parallel Acquisitions (GRAPPA) package.

Referring again to FIG. 1, the method 100 may further include removing artifacts associated with the acquisition of the GRE data at step 104 including, but not limited to, artifacts caused by physiological fluctuations of the subject during MRI scanning. The method 100 may further include Fourier transforming the k-space data at step 106 for each separate channel, and combining the data from different channels of the MRI scanning device at step 108. Combining data from different channels may enhance the estimation of quantitative parameters, such as MR signal decay rate constants, and may additionally remove any initial phase incoherence between channels. In one aspect, data from different channels are combined for each voxel into a single data set at step 108 using the strategy expressed in Eq. [1]:

$$S(TE) = \frac{1}{M} \cdot \sum_{m=1}^{M} \eta_m \cdot S^*(TE_1) \cdot S_m(TE), \eta_m = \frac{1}{M\sigma_m^2} \cdot \sum_{i=1}^{M} \sigma_i^2 \quad [1]$$

where the summation is taken over all the channels (m), $S^*$ denotes complex conjugate of S, $\lambda_m$ is a weighting parameter, $\sigma_m$ is a noise amplitude (r.m.s.); the index corresponding to voxel position is omitted for clarity. In one aspect, data from different scans are registered to minimize artifacts caused by possible inter-scan motions. By way of non-limiting example, multi-flip-angle scans may be registered using a FLIRT tool in FSL.

Referring again to FIG. 1, a function F(TE) is calculated at step 110 to account for macroscopic B0 field inhomogeneities. In one aspect, the function F(TE) can be obtained by a variety of methods including, but not limited to, the voxel spread function approach (VSF).

Referring again to FIG. 1, a theoretical model is fit at step 112 to the combined data from step 108 to determine at least one quantitative MRI parameter chosen from: spin density ($S_0$), longitudinal ($R_1$) and transverse ($R_2$) relaxation rate constants, as well as MT related relaxation parameters ($k_f'$ and $\lambda$). The combined data are analysed on a voxel-by-voxel basis using the theoretical model that takes into account cross-relaxation effects between "free" (intra- and extra-cellular) and "bound" (attached to macromolecules) water. In one aspect, the theoretical model used to determine at least one quantitative parameter is expressed by Eq. [2] and Eq. [3]:

$$S(\alpha, TR, TE, q) = S_0 \cdot \Psi(\alpha, TR, q) \cdot \exp(-R_2^* \cdot TE) \cdot \exp(i\Delta\omega \cdot TE) \cdot F(TE)$$

$$\Psi(\alpha, TR, q) = \frac{(1-E) - k_f' \cdot TR \cdot \frac{(\alpha q)^2}{\lambda \cdot (\nu \cdot \tau \cdot TR) + (\alpha q)^2}}{1 - E \cdot \cos(\alpha q)} \cdot \sin(\alpha q) \quad [2]$$

$$E = \exp(-R_1 \cdot TR); \lambda = R_2^{(b)} \cdot \left(R_1^{(b)} + k_b\right) \quad [3]$$
$$R_1 = R_1^{(f)} + k_f', k_f' = k_f \cdot \left(1 + k_b / R_1^{(b)}\right)^{-1}$$

In Eq. [2] and [3], the quantity $S_0$ is proportional to a spin density in the free water compartment free water; F(TE) represents the factor describing the signal decay due to the macroscopic field inhomogeneities (herein a voxel spread function (VSF) approach was used to compensate for this effect at step 110); superscripts/subscripts 'f' and "b" indicate "free" and "bound" water, respectively, $R_1$, $R_2$ and k are longitudinal, transverse, and cross-relaxation rate constants respectively; $\Delta\omega$ is the local frequency shift, $\tau$ is the RF pulse duration, and the v is a factor that depends on the RF pulse shape (for the rectangular RF pulses, v=1).

By fitting the theoretic model as summarized in Eq. [2] and Eq. [3] to the multi-flip-angle and multi-gradient-echo data, six parameters—$S_0$, $R_1$, $k_f'$, $\lambda$, $R_2^*$, and $\Delta\omega$ are obtained at step 112 in one aspect.

The value of the parameter $\lambda$ estimated at step 112 may have an associated estimation error. In an aspect, this estimation error may be corrected at step 112 using an average $\lambda$-value within a region surrounding each voxel with a predetermined size. Without being limited to any particular theory, this predetermined size may be selected to compromise between small characteristic sizes of tissue structures (i.e. on the order of a few mm) and the need to increase SNR and thereby decrease measurement error. In one aspect, this predetermined size may range from about 1 mm to about 100 mm.

Referring again to FIG. 1, a correction for B1 field inhomogeneities may be incorporated into the theoretical model used at step 112. In various aspects, the correction coefficient q can be obtained by different methods including, but not limited to, the method disclosed herein. In one aspect, the correction coefficient q may be obtained at step 111 using a method 200 as described in FIG. 2 and as disclosed in detail herein.

Referring again to FIG. 1, at step 114 the parameters determined at step 112 ($S_0$, $R_1$, $k_f'$, $\lambda$, $R_2^*$, and $\Delta\omega$) may be mapped and used to visualize structures including, but not limited to, structures within the brains of healthy subjects and subjects with brain disorders. These maps may further be used to diagnose and/or characterize a disorder in a patient including, but not limited to a brain disorder or disorders of any other organs that may be imaged using the SMART MRI method disclosed herein.

Figure 2:
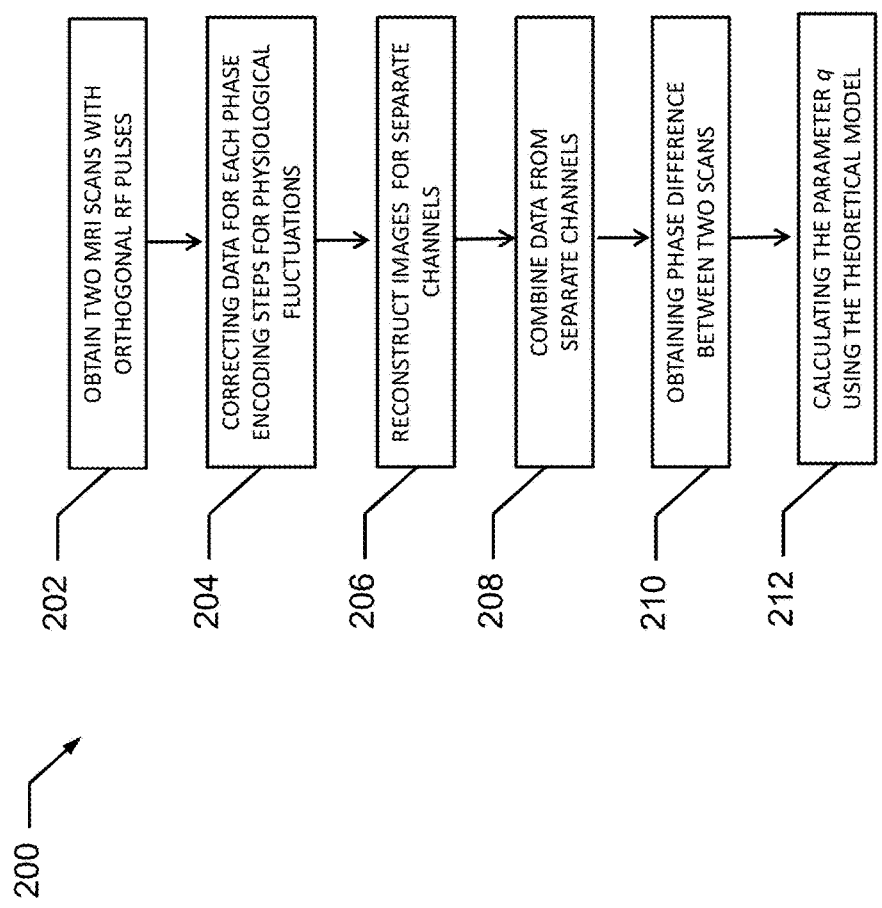
FIG. 2 is a flow chart illustrating a method of calculating the parameter q used for compensation of B1 field inhomogeneities according to one aspect.

FIG. 2 is a flow chart illustrating a method 200 for obtaining the parameter q for each voxel in one aspect. The method 200 may include a phase-based B1 mapping method that enables fast, accurate B1 mapping using a multi-channel phased-array coil. The efficiency of this method 200 for accurate quantification of human brain tissue relaxation and magnetization transfer parameters using the SMART MRI technique is demonstrated in examples provided herein below.

Referring again to FIG. 2, the method 200 of correction for B1 field inhomogeneities in this aspect includes obtaining two MRI scans at step 202, in which each MRI scan includes two orthogonal RF pulses. The method 200 may further include removing artifacts associated with the acquisition of the GRE data at step 204 including, but not limited to, artifacts caused by physiological fluctuations of the subject during MRI scanning. The method 200 may further include Fourier transforming the k-space data at step 206 for each separate channel, and combining the data from different channels of the MRI scanning device at step 208. Combining data from different channels may enhance the estimation of quantitative parameters, such as MR signal decay rate constants, and may additionally remove any initial phase incoherence between channels. In one aspect, data from different channels are combined for each voxel into a single data set at step 208 using the strategy expressed in Eq. [1] disclosed herein above. In one aspect, data from different scans are registered to minimize artifacts caused by possible interscan motions. By way of non-limiting example, multi-flip-angle scans may be registered using a FLIRT tool in FSL.

Referring again to FIG. 2, at step 210 the phases of the MR signals for both pairs of RF pulses may be obtained, and the differences between these phases may be calculated on a voxel-by-voxel basis to provide B1 field mapping. Based on theoretical expressions disclosed herein, this phase difference may be used to calculate an actual flip angle at step 212 which can deviate from a nominal flip angle.

The method for the B1 field correction disclosed herein is not limited to applications to the SMART MRI technique but can be used for any MR experiments requiring precise measurements of the B1 field.

II. Theoretical Model for SMART MRI Imaging Method

In various aspects, the SMART MRI method includes fitting a theoretical model to the assembled k-space data obtained using GRE imaging with multiple gradient echoes and multiple flip angles to obtain naturally co-registered maps of spin density ($S_0$), local frequency shift ($\Delta\omega$), longitudinal ($R_1$) and transverse ($R_2^*$) relaxation rate constants, MT (magnetization transfer) related relaxation parameters ($k_f'$ and $\lambda$). The theoretical model used to fit the GRE imaging data is an extension of a theoretical model derived using a Gradient Echo Plural Contrast Imaging (GEPCI) technique. The derivation of the theoretical model used in the SMART MRI imaging method is described in detail herein below.

A system comprising a pool of free water molecules (f-pool) and a pool of water bounded to macromolecules (b-pool), characterized by the magnetization vectors $M^{(f)}$ and $M^{(b)}$ respectively, is considered. Without being limited to any particular theory, in the presence of exchange between these two pools, the time evolution of $M^{(f)}$ and $M^{(b)}$ may be described by a system of 6 coupled Bloch equations. As described herein below, a pulse sequence comprising repetitive short RF pulses of durations z separated by repetition time TR characterized by $\tau \ll TR$, with the remaining transverse magnetization being destroyed before each consecutive RF pulse (spoiled GRE sequence) is considered. During time intervals between the RF pulses, evolution of the longitudinal and transverse components of magnetization are independent of each other, and the evolution of the longitudinal components $M_z^{(f)}$ and $M_z^{(b)}$ may be described using standard McConnell equations as expressed by Eq. [4]:

$$\frac{dM_z^{(f)}}{dt} = -k_f M_z^{(f)} + k_b M_z^{(b)} - R_1^{(f)} \cdot (M_z^{(f)} - M_0^{(f)}) \quad [4]$$

$$\frac{dM_z^{(b)}}{dt} = -k_b M_z^{(b)} + k_f M_z^{(f)} - R_1^{(b)} \cdot (M_z^{(b)} - M_0^{(b)})$$

Where $R_1^f = 1/T_1^f$ and $R_1^b = 1/T_1^b$, where $T_1^f$ and $T_1^b$ are the $T_1$-relaxation time constants of the compartments; $M_0^f$ and $M_0^b$ are the equilibrium compartmental magnetizations defined as $M_0^f = \zeta_f \cdot M_0$ and $M_0^b = \zeta_b \cdot M_0$ in which $M_0$ is the equilibrium magnetization of the whole system, and $\zeta_f$ and $\zeta_b$ are the volume fractions of the compartments, with $\zeta_f + \zeta_b = 1$. The cross-relaxation rate constants $k_f$ and $k_b$ are related to each other by the equilibrium condition: $k_b M_0^{(b)} = k_f M_0^{(f)}$. This relationship can be written in more symmetric notation using an exchange parameter K that is independent of pools' populations: $k_f = K \cdot \zeta_b$, $k_b = K \cdot \zeta_f$.

During a short on-resonance RF excitation pulse, the behaviors of magnetizations in the f-pool and the b-pool are substantially different. The magnetization vector of the f-pool $M^{(f)}$ is well known to rotate over a flip angle $\alpha$ determined by the RF field $B_1$: $\alpha = \omega_1 \tau$, $\omega_1 = \gamma B_1$ (for a non-rectangular RF pulse, $\omega_1$ should be substituted by its average value, $\overline{\omega_1}$). The relaxation and exchange processes during the short RF pulse ($\tau \sim 1$ msec) are well-known to play a negligible role on the f-pool.

In the b-pool the situation is substantially different. In this compartment, the longitudinal relaxation and exchange processes during the short RF pulse ($\tau \sim 1$ msec) still play a negligible role, while the transverse relaxation (rate constant $R_2^{(b)} \sim 10^5$ s$^{-1}$) substantially changes the dynamics of magnetization rotation. As a result, the effect of a short on-resonance RF pulse of duration on the longitudinal magnetization in the b-pool can be described by a mono-exponential function with the effective relaxation rate constant R', $$M_z^{(b)}(\tau) = M_z^{(b)}(0) \cdot \exp(-R'\tau), \quad R' = \frac{\omega_1^2}{R_2^{(b)}} \quad [5]$$

For a non-rectangular RF pulse, $\omega_1^2$ is substituted by its average value $\overline{\omega_1^2}$. The transverse components of the b-pool are negligibly small, $M_{x,y}^{(b)} \sim (\omega_1/R_2^{(b)}) \cdot M_z^{(b)} \ll M_z^{(b)}$.

During the intervals between the RF pulses, the longitudinal magnetizations of the f- and b-pools are described by Eq. [4]. Introducing a two-component vector $m = (M_z^{(f)}, M_z^{(b)})^T$ (T denotes a transpose operation), the solutions of Eq. [4] with the initial conditions $m(t=0)=m_0$ can be written in a convenient matrix form, as expressed in Eq. [6]:

$$m(t)=\hat{A}(t)\cdot m_0+(\hat{I}-\hat{A}(t))\cdot m_{eq}, \quad \hat{A}(t)=\exp(-\hat{R}\cdot t) \quad [6]$$

where $m_{eq}=(M_0^{(f)},M_0^{(b)})^T=M_0\cdot(\zeta_f,\zeta_b)^T$ describes the equilibrium state, $\hat{I}$ is the identity matrix, the matrix $\hat{R}$ is expressed by Eq. [7]:

$$\hat{R}=\begin{pmatrix} r_f & -k_b \\ -k_f & r_b \end{pmatrix}, r_{f,b}=R_1^{(f,b)}+k_{f,b} \quad [7]$$

and the elements of the matrix $\hat{A}$ are expressed in Eq. [8]:

$$A_{11}=\frac{1}{q}\cdot(p_+e_- - p_-e_+), A_{12}=\frac{k_2}{q}\cdot(e_+ - e_-) \quad [8]$$
$$A_{22}=\frac{1}{q}\cdot(p_+e_+ - p_-e_-), A_{21}=\frac{k_1}{q}\cdot(e_+ - e_-)$$

where the following notations are introduced as expressed on Eq. [9]:

$$e_\pm=\exp(\lambda_\pm\cdot TR), \lambda_\pm=\frac{1}{2}\cdot[-(r_f+r_b)\pm q],$$
$$p_\pm=\frac{1}{2}\cdot(r_f-r_b\pm q), q=[(r_f-r_b)^2+4k_fk_b]^{1/2} \quad [9]$$

The two-component vectors m before ($m_-$) and after ($m_+$) the RF pulse can be related by the diagonal matrix $\hat{C}$ as expressed in Eq. [10]:

$$m_+=\hat{C}(\alpha)\cdot m_-, \hat{C}(\alpha)=\begin{pmatrix} \cos\alpha & 0 \\ 0 & e' \end{pmatrix}, e'=\exp(-R'\tau) \quad [10]$$

Under the steady-state condition for an ideally spoiled gradient echo sequence with the repetition time TR, the vectors $m_+$ and $m_-$ are also related by Eqn. (11):

$$m_-=\hat{A}(TR)\cdot m_+ +(\hat{I}-\hat{A}(TR))\cdot m_{eq} \quad [11]$$

Combining Eqs. [10] and [11], the following expression for the steady-state vector $m_s\equiv m_-$ is derived just before the RF pulses, expressed in Eq. [12]:

$$m_s(TR,\alpha)\equiv(M_{zs}^{(f)},M_{zs}^{(b)})^T=[\hat{I}-\hat{A}(TR)\cdot\hat{C}(\alpha)]^{-1}\cdot[\hat{I}-\hat{A}(TR)]\cdot m_{eq} \quad [12]$$

Due to a very short $T_2$ (about 10 μsec), the bound water does not contribute to the GRE signal in the msec range. The transverse component of the magnetization of the free water pool just after the RF pulse, $M_\perp^{(f)}$, is determined by the f-pool component of the vector $m_s(TR, \alpha)$, $M_\perp^{(f)}=M_{zs}^{(f)}(TR, \alpha)\cdot\sin\alpha$, and the measured GRE signal S(TE) can be written as Eq. [13]:

$$S=\eta\cdot M_{zs}^{(f)}(TR,\alpha)\cdot\sin\alpha\cdot\exp(-\Gamma(TE))\cdot\exp(i\Delta\omega\cdot TE) \quad [13]$$

where η is a proportionality coefficient between the signal and the transverse magnetization, depending on the RF coil sensitivity; Γ(TE) is the attenuation function describing transverse relaxation of the GRE signal, and Δω·TE describes the MR signal frequency depending on the field inhomogeneities and local tissue-specific frequency shifts. The transverse MR signal attenuation function Γ(TE) includes the effects of the internal decay of f-pool water, characterized by a $R_2^{*(f)}$ relaxation rate constant, and the exchange effects with the b-pool, as expressed in Eq. [14]:

$$\Gamma(TE)=R_2^*\cdot TE; R_2^*=R_2^{*(f)}+k_f \quad [14]$$

Under the actual experimental conditions, Γ(TE) further includes the effects of mesoscopic field inhomogeneities resulting from the presence of a blood vessel network (BOLD effect) and macroscopic field inhomogeneities (background gradients).

The $M_{zs}^{(f)}$ component of Eq. [12] may be expressed as Eqs. [15], [16], and [17]:

$$M_{zs}^{(f)}=M_0^{(f)}\cdot\frac{1-E'}{1-E'\cdot\cos\alpha}+M_0^{(b)}\cdot\frac{E''}{1-E'\cdot\cos\alpha} \quad [15]$$

$$E'=\frac{A_{11}-\det\hat{A}\cdot e'}{1-A_{22}\cdot e'}=\frac{p_+e_-(1-e_+e')-p_-e_+(1-e_-e')}{p_+(1-e_+e')-p_-(1-e_-e')} \quad [16]$$

$$E''=\frac{A_{12}\cdot(1-e')}{1-A_{22}\cdot e'}=-k_b\cdot\frac{(1-e')\cdot(e_+-e_-)}{p_+(1-e_+e')-p_-(1-e_-e')} \quad [17]$$

In the absence of exchange between the pools (K=0), the quantity E''=0, and Eq. [15] reduces to the classical Ernst's expression for the steady-state magnetization as expressed in Eq. [18]:

$$M_{zs}^{(f)}=M_0^{(f)}\cdot\frac{1-E_1}{1-E_1\cdot\cos\alpha}, E_1=\exp(-R_1^{(f)}\cdot TR) \quad [18]$$

It is worth noting that E''=0 when e'=1. This latter case corresponds to an approximation in which the longitudinal magnetization in the b-pool is assumed to remain unchanged during the RF pulses.

Due to the presence of the function e', both of the functions E' and E'' depend on the flip angle α through the parameter R'. For a RF pulse of duration τ, the flip angle of a free pool is defined by the equation $\alpha=\overline{\omega}_1\tau$, and e' may be expressed by Eq. [19]:

$$e'=\exp\left(-\frac{\overline{\omega_1^2}}{R_2^{(b)}}\cdot\tau\right)=\exp\left(-\frac{\alpha^2}{v\cdot R_2^{(b)}\tau}\right) \quad [19]$$

where the factor $v=(\overline{\omega}_1)^2/\overline{\omega_1^2}$ depends on the shape of the RF pulse (v=1 for a rectangular RF pulse). Interestingly, for a fixed flip angle, the function e' decreases as τ decreases. For a typical τ~1 msec, due to high transverse relaxation rate constant $R_2^{(b)}\sim 10^5$ s$^{-1}$, the difference (1−e') is small and can be approximated as expressed in Eq. [20]:

$$1-e'\approx\frac{\alpha^2}{v\cdot R_2^{(b)}\tau}<<1 \quad [20]$$

Using this inequality, the expression for the signal S under the steady-state condition can be presented in a form expressed in Eq. [21]:

$$S(\alpha, TR, TE)=S_0\cdot\Psi(\alpha, TR)\cdot\exp(-\Gamma(TE))\cdot\exp(i\Delta\omega\cdot TE)$$

$$\Psi(\alpha, TR)=\frac{(1-E)-\dfrac{G_1\cdot\alpha^2}{G_2+\alpha^2}}{1-E\cdot\cos\alpha}\cdot\sin\alpha \quad [21]$$

where $S_0=\eta M_0^{(f)}$; E and $G_{1,2}$ are the functions of the model parameters and the repetition time TR.

The function $\Psi(\alpha, TR)$ of Eq. [21] generalizes Ernst's expression for the steady-state magnetization (see Eq. [18]) in several ways. First, Eq. [21] contains an additional term in the numerator depending on the flip angle $\alpha$; this term is due to the presence of E" in Eq. [15] and, as mentioned above, is equal to 0 if K=0 (no exchange between the pools) and/or e'=1 (the longitudinal magnetization in the b-pool during the RF pulses remains unchanged). Second, in contrast to the exponent $E_1$ with a single relaxation rate constant $R_1^{(f)}$ shown in Eq. [18], the function E=E(TR) of Eq. [21] depends on the repetition time TR in a non-monoexponential way. Moreover, the expression of Eq. [21] depends on four independent model parameters: $R_1^{(f)}$, $R_1^{(b)}$, $k_f=K\cdot\zeta_b$, $k_b=K\cdot(1-\zeta_b)$.

Figure 10:
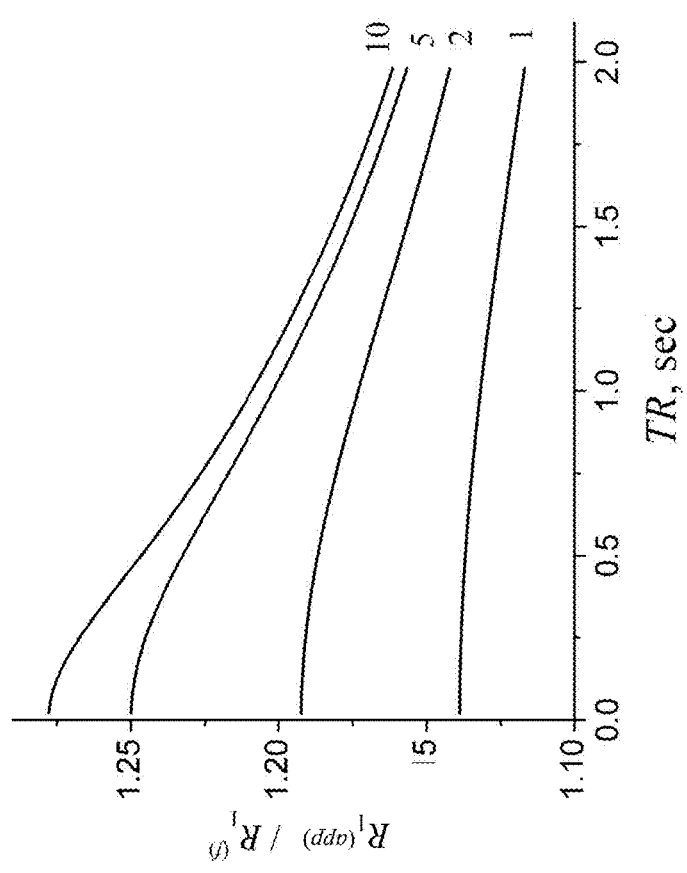
FIG. 10 is a graph of the ratio $R_1^{(app)}/R_1^{(f)}$ as a function of the repetition time TR at different values of the exchange rate constant K (in sec$^{-1}$, shown by numbers by the lines); $R_1^{(f)}=0.8$ s$^{-1}$, $R_1^{(b)}=1$ s$^{-1}$, $\zeta_b=0.2$.

An apparent longitudinal relaxation rate constant of the free-water compartment, $R_1$, is still introduced, which however depends on TR: $R_1^{(app)}(TR)=-(\ln E)/TR$, as illustrated in FIG. 10.

At sufficiently short repetition times, the function E(TR) linearly decreases with TR: $E\approx 1-R_1\cdot TR$, where $R_1$ is the relaxation rate constant of the free water compartment modified by the exchange with the b-pool as expressed by Eq. [22]:

$$R_1=R_1^{(f)}+k_f', \quad k_f'=k_f(1+k_b/R_1^{(b)})^{-1} \quad [22]$$

Hence, for short TR, $R_1^{(app)}=R_1$. The parameter $k_f'$ can be considered as an effective exchange rate constant.

Figure 11:
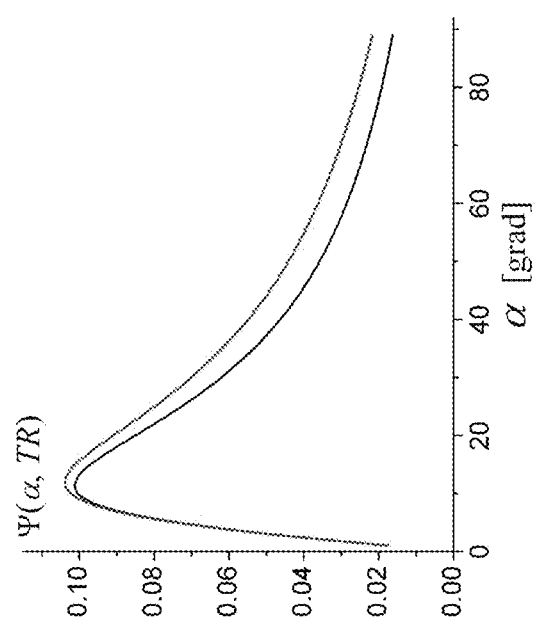
FIG. 11 is graph of the function $\Psi(\alpha, TR)$ as a function of the flip angle $\alpha$ for two different values of $k_f'$. The black line corresponds to $k_f'=0.35$ s$^{-1}$, TR=18 ms, v=1, $\tau$=0.4 ms, $R_1$=1.2 s$^{-1}$, $k_f'=0.35$ s$^{-1}$, and $\lambda$=6·10$^4$ s$^{-1}$. The red line corresponds to $k_f'=0$, TR=18 ms, v=1, $\tau$=0.4 ms, $R_1$=1.2 s$^{-1}$, and $\lambda$=6·10$^4$ s$^{-1}$.

At short TR, the functions $G_{1,2}$ are proportional to TR, and $\Psi(\alpha, TR)$ can be expressed as Eq. [23]:

$$\Psi(\alpha, TR) = \frac{(1-E)-k_f'\cdot TR \cdot \frac{\alpha^2}{\lambda\cdot(v\cdot\tau\cdot TR)+\alpha^2}}{1-E\cdot\cos\alpha}\cdot\sin\alpha \quad [23]$$

where $E=\exp(-R_1\cdot TR)$; $\lambda=R_2^{(b)}\cdot(R_1^{(b)}+k_b)$. The typical dependence of the function $\Psi(\alpha, TR)$ on $\alpha$ is illustrated in FIG. 11.

The last term in the numerator in Eq. [23] is proportional to the exchange rate constant $k_f=\zeta_b\cdot K$. It should be mentioned that typical values of all the relaxation and cross-relaxation rate constants are about ~1 s$^{-1}$ (except $R_2^{(b)}$~10$^5$ s$^{-1}$). The parameter $k_f'$ is of the same order—$k_f'$~1 s$^{-1}$, whereas $\lambda$~10$^5$ s$^{-2}$. The dimensionless product of $\lambda$ and the sequence parameters, $\lambda\cdot(v\cdot\tau\cdot TR)$, appearing in Eq. [23], for typical values of $\tau$~1 ms, TR~10 ms, and v~1, is also about 1, and can be of the same order as $\alpha^2$, hence it is important for data analysis.

As follows from Eqs. [14], [21] and [23], by varying the flip angle $\alpha$ (for fixed TR), six independent parameters can be obtained by fitting the signal to experimental data: the amplitude $S_0$, the longitudinal and transverse relaxation rate constants $R_1$ and $R_2^*$ (accounting for the exchange with the b-pool), the local frequency shift $\Delta\omega$, and the parameters $k_f'$ and $\lambda$. According to Eq. [22], the difference $R_1-k_f'$ gives $R_1^{(f)}$—the longitudinal relaxation rate constant of the f-pool.

Important practical questions also include (a) how does noise in the experimental data affect estimation of model parameters and (b) what is the optimal choice of experimental sequence parameters for obtaining the best possible parameter estimates (given restricted imaging time). To address these questions, Bayesian analysis may be used to examine how the estimated model parameters depend on their "true values", signal-to-noise ratio, and data sampling.

The analysis disclosed herein below is restricted to the signal magnitude, $S_a(\alpha, TR, TE)=|S(\alpha, TR, TE)|$, as expressed in Eq. [24]:

$$S_a(\alpha,TR,TE)=S_0\cdot\Psi(\alpha,TR)\cdot\exp(-\Gamma(TE)) \quad [24]$$

The analysis disclosed herein below is further restricted to an experiment with fixed TR and variable flip angles.

The basic quantity in Bayesian analysis is a joint posterior probability $P(\{p_j\}|Data, \sigma, I)$ for model parameters $\{p_j\}=\{S_0, R_2^*, R_1, k_f', \lambda\}$ given all of the data Data, the noise standard deviation $\sigma$, and the prior information I. A high signal-to-noise approximation is expressed by Eq. [25]:

$$P(\{p_j\}|Data, \sigma, I) \propto \exp(-Q/2\sigma^2) \quad [25]$$

$$Q = \sum_{n,m}\left[\hat{S}_a(\{\alpha_n, TE_m\}; \{\hat{p}_j\}) - S_a(\{\alpha_n, TE_m\}; \{p_j\})\right]^2$$

The double sum in Eq. [25] is performed over all the flip angles $\alpha_n$ as well as the full range of echo times $TE_m$ used in obtaining the GRE imaging data. The function $\hat{S}_a(\{\alpha_n, TE_m\}; \{\hat{p}_j\})$ represents Data and is determined from the model $S_a(\{\alpha_n, TE_m\}; \{p_j\})$ by substituting the parameters $\{p_j\}=\{S_0, R_2^*, R_1, k_f', \lambda\}$ with their "true" values $\hat{p}_i$.

To estimate any parameter in the model, a posterior probability for the parameters should be calculated, from which the estimated values of the parameters can be found as expressed in Eq. [26]:

$$(p_j)_{est}=\hat{p}_j\pm\Delta p_j, \quad \Delta p_j=SNR_0^{-1}\cdot(\Delta_j/\Delta)^{1/2} \quad [26]$$

where $\Delta p_j$ are the expected uncertainties of the estimated parameters, $SNR_0=S_0/\sigma$ is the signal-to-noise ratio; $\Delta$ is the determinant of the variance-covariance matrix $\hat{V}$ with the rank M equal to the number of model parameters, and $\Delta_j$ is the minor of this matrix corresponding to the diagonal element jj. The matrix elements of $\hat{V}$ are determined by the derivatives of the function $S_a(\{\alpha_n, TE_m\}; \{p_j\})$ as expressed in Eq. [27]:

$$V_{ij} = \sum_{n=0}^{N-1} S_i(\{\alpha_n, TE_m\}; \{\hat{p}_j\})S_j(\{\alpha_n, TE_m\}; \{\hat{p}_j\}), \quad S_i = (\partial S_a/\partial p_i)_{p_i=\hat{p}_i} \quad [27]$$

The experimental SNR is much smaller than the quantity $SNR_0$: the latter formally corresponds to the GRE signal that would be acquired at $\alpha=\pi/2$ and $TR\to\infty$. Actual amplitude of the GRE signal depends on TR and the flip angle $\alpha$; for the model parameters used previously, the SNR corresponding to the maximal amplitude of the GRE signal (achieved at $\alpha=\alpha_*\approx 11°$) is about $SNR\approx 0.1\cdot SNR_0$.

Optimal parameters of the pulse sequence correspond to a set of the sequence parameters $\alpha_n$ and echo times $TE_m$ that minimize the expected uncertainties $\Delta p_j$. The uncertainties $\Delta p_j$ can be made smaller by increasing the number of acquired data points N. Roughly speaking, the uncertainties decrease as $1/\sqrt{N}$. However, in actual practice, the total time for data acquisition is limited and a reasonable trade-off between a total number of measurements and precision should be used. FIG. 12A, FIG. 12B, FIG. 12C, and FIG. 12D each illustrate the dependence of relative uncertainties per a unit measurement, $\delta p_j=(\Delta p_j/p_j)\cdot\sqrt{N_\alpha}$, on the maximal flip angle $\alpha_{max}$ for different minimal flip angles $\alpha_{min}$.

The relative errors (per unit measurement) of the signal amplitude $S_0$ (not shown) and the relaxation rate constant $R_2^*$ (see FIG. 12A) have clear minima corresponding to the flip angles close to that at which the signal amplitude as a function of α has a maximum. The relative error of the parameters $R_1$ (see FIG. 12B) and $k_f'$ (see FIG. 12C) have shallow minima at α~60°, whereas the relative error of the parameter λ (see FIG. 12D) monotonically decreases as α increasing.

Achieving the highest measurement precision for different model parameters nay require a different sequence design depending on the desired SMART MRI parameters to be obtained. To obtain $S_0$ and $R_2^*$, the precision may be significantly enhanced when the maximal flip angle $α_{max}$ only slightly exceeds $α_*$ (~11° in this exemplary case), whereas the parameters $R_1$, $k_f'$, and λ may make use of much bigger flip angles.

As demonstrated, the relative uncertainties for the model parameters are smaller for smaller $α_{min}$ for all model parameters except $δR_2^*$. For $δR_2^*$, the relative uncertainties of estimates may be significantly lower (in this exemplary case) at $α_{min} \approx 11°$.

In real experiments, a flip angle α may deviate from its nominal (input) value due to inhomogeneities of the B1 field. To account for this effect the nominal flip angle α within the function Ψ in Eq. [23] may be substituted by a corrected value (qα), where the parameter q describes the effect of B1 field inhomogeneities.

The presence of macroscopic field inhomogeneities may also be taken in consideration in some aspects. Herein, the effect of these inhomogeneities is accounted for in the framework of the voxel spread function (VSF) approach, in which macroscopic field inhomogeneities are represented by an additional factor F(TE) that describes the signal decay due to the macroscopic field inhomogeneities. In one aspect, the theoretical model used in the SMART MRI methods described herein may incorporate F(TE) as expressed in Eq. [28]:

$$S(\alpha, TR, TE, q) = \\ S_0 \cdot \Psi(\alpha, TR, q) \cdot \exp(-R_2^* \cdot TE) \cdot \exp(i\Delta\omega \cdot TE) \cdot F(TE)$$

$$\Psi(\alpha, TR, q) = \frac{(1-E) - k_f' \cdot TR \cdot \frac{(\alpha q)^2}{\lambda \cdot (v \cdot \tau \cdot TR) + (\alpha q)^2}}{1 - E \cdot \cos(\alpha q)} \cdot \sin(\alpha q) \quad [28]$$

III. B1 Field Correction.

The disclosed B1 mapping technique is based on using two orthogonal B1 field excitation RF pulses and a GRE sequence with multiple gradient echoes. Such RF pulses generate an MR signal with the phase depending on the RF pulse amplitude, hence a flip angle. The gradient echo train of the GRE sequence allows mapping the local frequency shifts of the MR signal. Combining the phase and frequency measurements with the theoretical expression derived for the MR signal phase enables the calculation of a local B1 field strength. Since the MR signal phase depends on instrumental factors and is diverse across different RF channels in the phased-array coil, previously developed optimized methods were used for combining multi-channel data, allowing for optimal parameters' estimation. The disclosed method also makes use of a theoretical analysis of pulse sequence optimization for selecting flip angles in the orthogonal pair of RF pulses as described in detail herein below.

In an aspect, the disclosed phase-sensitive approach to the B1 mapping is based on applying two consecutive RF pulses of different (orthogonal) orientations which generate the signal phase $\varphi = \varphi(\alpha, \beta, \Delta\omega)$ depending on the flip angles α and β as well as on the frequency shift $\Delta\omega = \gamma \cdot \Delta B_0$ (due to the field offset from the resonance field $B_0$). The first RF α-pulse of duration $\tau_\alpha$ and strength $b_1$ ($\alpha = \gamma \cdot b_1 \cdot \tau_\alpha$) along the X-axis (in the rotating frame) is immediately followed by the second RF β pulse of duration $\tau_\beta$ and strength $b_2$ ($\beta = \gamma \cdot b_2 \cdot \tau_\beta$) β pulse of duration $\tau_\beta$ and strength $b_2$ ($\beta = \gamma \cdot b_2 \cdot \tau_\beta$) about the Y-axis.

The magnetization M(α, β, Δω) after the two RF pulses can be readily found from the Bloch equations for arbitrary α, β and Δω. In the case Δω=0, the components of the magnetization M(α, β, 0) after a (α, β)-pair of the RF pulses may be expressed as Eq. [29]:

$$M_x = -M(0) \cdot \cos\alpha \cdot \sin\beta$$

$$M_y = M(0) \cdot \sin\alpha$$

$$M_z = M(0) \cdot \cos\alpha \cdot \cos\beta \quad [29]$$

The initial magnetization M(0) is oriented along B0 (Z-axis); the relaxation processes during short RF pulses hereafter may be ignored. Thus, the phase φ of nuclear magnetization is given by Eq. [30]:

$$\varphi(\alpha, \beta) = \arctan\left(\frac{M_x}{M_y}\right) = -\arctan(\cot\alpha \cdot \sin\beta) \quad [30]$$

However, the phase of MR signal is different from the phase of nuclear magnetization from Eq. [30]. The phase of the MR signal may depend on different instrumental factors (RF coil sensitivity, etc.) and may be specific for each channel n in a phased-array coil.

The phase of MR signal is given by Eq. [31]:

$$\varphi_{meas,n} = \varphi(\alpha,\beta) + \varphi_{0,n} \quad [31]$$

The initial phases $\varphi_{0,n}$ are different for different channels while the phase of magnetization φ(α, β) is the same. To eliminate the unknown phases $\varphi_{0,n}$, it is convenient to use the second acquisition in which the second RF pulse is applied in an opposite direction to the first acquisition, resulting in the rotation angle -β. The phase measured in this experiment may be expressed as:

$$\varphi_{meas,n}' = \varphi(\alpha,-\beta) + \varphi_{0,n} \quad [32]$$

where the phase φ(α,-β) is given by Eq. [30] with the substitution β→-β. The phase difference between the two measurements is independent from $\varphi_0$ and is determined only by the flip angles α and β, as expressed in Eq. [33]:

$$\Delta\varphi = \varphi_2 - \varphi_1 = 2 \cdot \arctan(\cot\alpha \cdot \sin\beta) \quad [33]$$

Under experimental conditions, the actual flip angles (α and β) are different from the nominal (input) flip angles. However, since both the flip angles (α and β) are proportional to the strength of the corresponding RF field, their actual values differ from the nominal ones by the same factor q: α ⇒ α·q, β ⇒ β·q. Hence, Eq. [33] is a function of only one unknown parameter q that can be determined, thus providing information on the actual strength of RF field B1.

To optimize the MR pulse sequence for B1 field mapping, the nominal flip angles should be chosen in such a way to minimize an error in determination of the factor q. For this purpose, the phase difference in Eq. [33] should be analyzed as a function of q as expressed in Eq. [34]:

$$\Delta\varphi \to \Delta\varphi(\alpha \cdot q, \beta \cdot q) \quad [34]$$

An estimation error δq is proportional to the uncertainty of the phase, δ(Δφ), as expressed in Eq. [35]:

$$\delta q = \delta(\Delta\varphi) \cdot G(\alpha, \beta, q),$$ [35]

$$G(\alpha, \beta, q) = \left[\frac{\partial(\Delta\varphi)}{\partial q}\right]^{-1} = \frac{1 - \cos^2\alpha q \cdot \cos^2\beta q}{\beta \cdot \sin 2\alpha q \cdot \cos\beta q - 2\alpha \cdot \sin\beta q}$$

The uncertainty of the phase $\delta(\Delta\varphi)$ is known to be influenced by the signal-to-noise ratio (SNR), $\delta(\Delta\varphi)=1/\text{SNR}=\sigma/A$, where $\sigma$ is the noise level and A is the signal amplitude proportional to the transverse magnetization $M_\perp = (M_x^2 + M_y^2)^{1/2}$, the latter being a function of the flip angles $\alpha$ and $\beta$. Under the steady-state condition, the amplitude of the MR signal for the $(\alpha,\beta)$-pair of the RF pulses may be expressed as Eq. [36]:

$$A(\alpha, \beta) = S_0 \cdot \frac{(1-E) \cdot (1 - \cos^2\alpha \cdot \cos^2\beta)^{1/2}}{1 - E \cdot \cos\alpha \cdot \cos\beta}$$ [36]

where $E=\exp(-TR/T1)$, TR is the repetition time, T1 is the T1-relaxation time and $S_0$ is a signal magnitude corresponding to TR=∞.

In the case q=1, the estimation error $\delta q$ can be expressed as Eq. [37]:

$$\delta q = \frac{G(\alpha, \beta)}{A(\alpha, \beta)} = \frac{\sigma}{S_0} \cdot F(\alpha, \beta),$$ [37]

$$F(\alpha, \beta) = \frac{(1 - E \cdot \cos\alpha \cdot \cos\beta) \cdot (1 - \cos^2\alpha \cdot \cos^2\beta)^{1/2}}{(1-E) \cdot (\beta \cdot \sin 2\alpha \cdot \cos\beta - 2\alpha \cdot \sin\beta)}$$

Figures 16A, 16B, 16C:
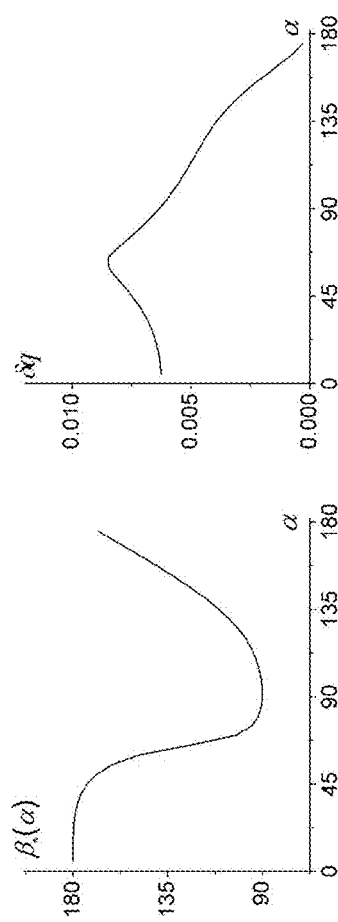
FIG. 16A is a graph of a second flip angle, $\beta_*=\beta_*(\alpha)$, corresponding to the minimum of the function $F(\alpha, \beta)$ with respect to $\beta$ at a given $\alpha$.
FIG. 16B is a graph of an estimation error, $\delta q$, corresponding to the flip angle pair $(\alpha, \beta_*(\alpha))$ as a function of flip angle $\alpha$.
FIG. 16C is a graph of SAR (specific absorption rate) for the flip angle pair $(\alpha, \beta_*(\alpha))$ as a function of flip angle $\alpha$. Both the pulses are assumed to have the same duration. The system and sequence parameters are: T1=1 s, TR=30 ms, SNR=50 for the sequence with $\alpha=\beta=90°$.

For a given system T1 and pulse sequence TR, an optimal choice of the flip angles $\alpha$ and $\beta$ corresponds to the minimum of the function $F(\alpha, \beta)$. FIG. 16A illustrates the dependence of the second flip angle, $\beta_* = \beta_*(\alpha)$, minimizing the function $F(\alpha, \beta)$ at a given $\alpha$. The values of the estimation error $\delta q$ as a function of the first flip angle $\alpha$, corresponding to the flip angles pair $(\alpha, \beta_*(\alpha))$, are plotted in FIG. 16B.

Note that the dependence of $\beta_*$ on $\alpha$ is non-monotonic: $\beta_*(\alpha)$ has a minimum at $\alpha=90°$ where $\beta_*(\alpha=90°)=90°$, whereas both small and large initial flip angles $\alpha$ require large flip angles $\beta_*$ (around 180°). For given values of TR and T1, the estimation error $\delta q$ has a maximum at $\alpha\sim65°$ and then decreases with $\alpha$ increases. Hence, the estimation error $\delta q$ tends to zero with both the flip angles increase.

However, experimental values of flip angles used in human experiments may be restricted by the RF power deposition characterized by the Specific Absorption Rate (SAR). The SAR is proportional to the energy of the RF pulses, SAR$\sim(\alpha_2+\beta^2)$ (for both the pulses of the same duration). The dependence of SAR on the flip angles pair $(\alpha, \beta_*(\alpha))$ is illustrated in FIG. 16C. For given values of TR and T1, the relationship of SAR with flip angle as illustrated in FIG. 16C has a minimum at $\alpha\sim75°$. Thus, the optimal choice of the flip angles should be a "trade-off" between minimizing the estimation error $\delta q$ and the SAR.

The above analysis corresponds to the case when the offset of B0 field is neglected. For the specific case $\alpha=\beta$, $\tau_\alpha=\tau_\beta$, the quantity $\Delta\varphi$ corresponding to the difference of the phases for two pairs of the RF pulses $(\alpha, \alpha)$ and $(\alpha, -\alpha)$ can be expressed as Eq. [38]:

$$\Delta\varphi = \arctan\left[\frac{2\Omega^2 \cdot (p^2 + \alpha^2\cos\Omega)}{\alpha^2 \cdot (1-\cos\Omega) \cdot (\alpha^2 + (p^2+\Omega^2) \cdot \cos\Omega)}\right]$$ [38]

where $p=\Delta\omega\cdot\tau$, $\Omega=(\alpha^2+p^2)^{1/2}$.

For the general case in which $\alpha$ is not necessarily equal in magnitude to $\beta$, the quantity $\Delta\varphi$ corresponding to the difference of the phases for two pairs of the RF pulses $(\alpha, \beta)$ and $(\alpha, -\beta)$ can be expressed as Eq. [38B]:

$$\tan(\Delta\varphi) = \left\{2\alpha \cdot \beta \cdot (p^2 + \alpha^2 \cdot \cos\Omega_\alpha) \cdot \right.$$ [38B]

$$\left[4p^2 \cdot \Omega_\beta^2 \cdot \cos\Omega_\beta \cdot \sin^2\left(\frac{\Omega_\alpha}{2}\right) \cdot \sin^2\left(\frac{\Omega_\beta}{2}\right) + \right.$$

$$\left.+\Omega_\alpha\Omega_\beta^3 \cdot \sin\Omega_\alpha \cdot \sin\Omega_\beta - 2p^2 \cdot \Omega_\beta^2 \cdot \sin^2\left(\frac{\Omega_\alpha}{2}\right) \cdot \sin^2\Omega_\beta\right]\right\} /$$

$$\left\{p^6 \cdot \beta^2 - \alpha^2 \cdot \beta^4 \cdot \Omega_\alpha^2 \cdot \sin^2\Omega_\alpha - \right.$$

$$2 \cdot p^2 \cdot \beta^2 \cdot \cos\Omega_\beta \cdot (p^4 + \alpha^2 \cdot \Omega_\alpha^2 \cdot \sin^2\Omega_\alpha) - $$

$$-\cos^2\Omega_B \cdot \left[-p^6 \cdot \beta^2 \cdot p^2 \cdot \alpha^2 \cdot \left(4 \cdot \Omega_\beta^4 \cdot \right.\right.$$

$$\left.\sin^4\left(\frac{\Omega_\alpha}{2}\right) + p^2 \cdot \Omega_\alpha^2 \cdot \sin^2\Omega_\alpha\right)\right] + +$$

$$8 \cdot p^2 \cdot \alpha^2 \cdot \beta^2 \cdot \cdot \Omega_\alpha\Omega_\beta \cdot \sin^2\left(\frac{\Omega_\alpha}{2}\right)$$

$$\sin^2\left(\frac{\Omega_\beta}{2}\right) \cdot \sin\Omega_\alpha \cdot \sin\Omega_\beta - -p^2 \cdot \Omega_\beta^2 \cdot$$

$$(p^2 \cdot (\alpha^2 - \beta^2) + \alpha^2 \cdot \Omega_\alpha^2 \cdot \sin^2\Omega_\alpha) \cdot \sin^2$$

$$\Omega_\beta + +2 \cdot p^2 \cdot \alpha^2 \cdot \cos\Omega_\alpha \cdot \left[4p^2 \cdot \beta^2 \cdot \right.$$

$$\left.\sin^4\left(\frac{\Omega_\beta}{2}\right) + \Omega_\beta^4 \cdot \sin^2\Omega_\beta\right] + +\alpha^2 \cdot$$

$$\cos^2\Omega_\alpha \cdot \left[4p^2 \cdot \alpha^2 \cdot \beta^2 \cdot \sin^4\left(\frac{\Omega_\beta}{2}\right) + \right.$$

$$\left.(\alpha^2\beta^2 - p^4) \cdot \Omega_\beta^2 \cdot \sin^2\Omega_\beta\right]\right\}$$

in which $\alpha$ is a flip angle of the first excitation RF pulse, $\beta$ is the flip angle of the second excitation RF pulse, $p=\Delta\omega\cdot\tau$, $\Omega_\alpha=(\alpha^2+p^2)^{1/2}$, $\Omega_\beta=(\beta^2+p^2)^{1/2}$, Due to B1 field inhomogeneities, the actual flip angles ($\alpha$ and $\beta$) are different from the nominal (input) flip angles. However, since both the flip angles ($\alpha$ and $\beta$) are proportional to the strength of the corresponding RF field, their actual values differ from the nominal ones by the same factor q: $\alpha \Rightarrow \alpha\cdot q$, $\beta \Rightarrow \beta\cdot q$. Hence, Eqs. [38] and [38.B] are functions of only one unknown parameter q that can be determined, thus providing information on inhomogeneities of RF field B1.

The presence of the B0 field-dependent frequency offset $\Delta\omega$ leads to a different relationship between the flip angle $\alpha$ and the phase shift $\Delta\varphi$, i.e. Eq. [38] rather than Eq. [33](with $\alpha=\beta$). Hence, using Eq. [33] instead of Eq. [38] would lead to a systematic error in flip angle evaluation. The relationship between an erroneous flip angle $\alpha'$ and an actual flip angle $\alpha$ can be found by solving expression of Eq. [39]:

$$\Delta\varphi(\alpha,\Delta\omega)=\Delta\varphi(\alpha',0)$$ [39]

Figure 17:
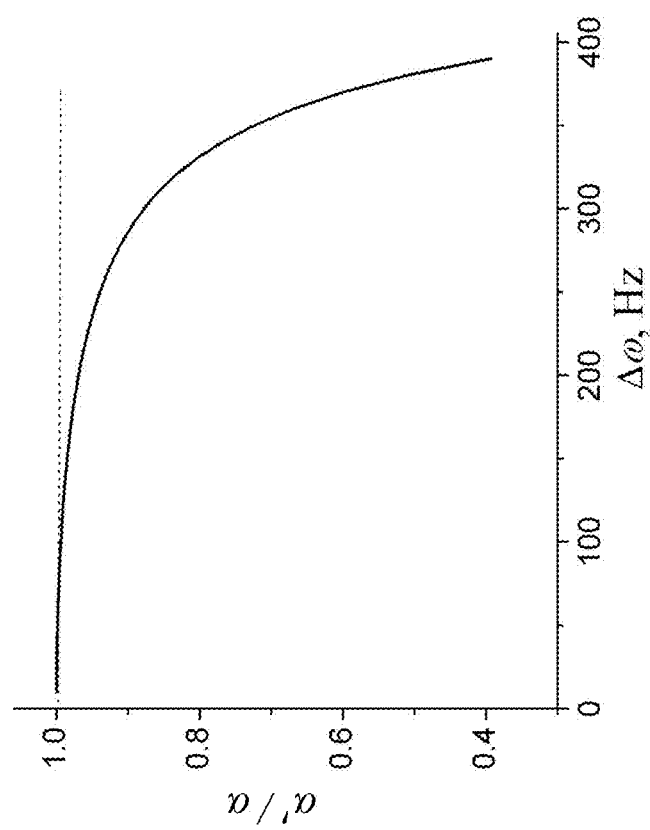
FIG. 17 is a graph of the ratio $\alpha'/\alpha$, as a function of the frequency shift $\Delta\omega$ for $\alpha=\pi/2$ and $\tau$=0.4 msec.

The numerical solution of Eq. [39] for $\alpha=\pi/2$ as a function of the frequency offset $\Delta f=\Delta\omega/2\pi$ is shown in FIG. 17. For sufficiently small $\Delta f<200$ Hz, the ratio $\alpha'/\alpha$ is very close to 1. However, for higher $\Delta f$, this ratio substantially deviates from 1, and this effect should be taken into account.

Figure 18:
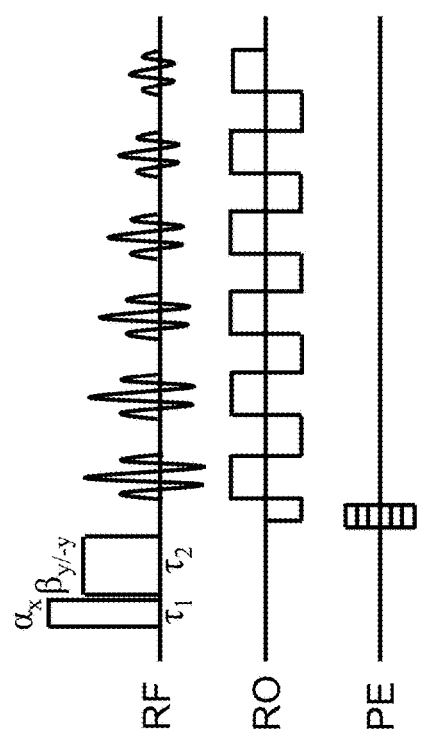
FIG. 18 contains schematic diagrams illustrating a pulse sequence for B1 mapping, including radio frequency pulses (RF, top graph), read-out pulses (RO, middle graph) and phase encoding pulses (PE, bottom graph).

FIG. 18 is a schematic diagram of a pulse sequence used for B1 field mapping and for calculating the correction parameter q. RF, RO and PE represent radio frequency; read-out and phase encoding, respectively.

A phased-array coil may be used to create a map of B1 field for each imaging voxel. To optimize this measurement, the signals from different channels of the phased-array were combined according to Eq. [1] and Eq. [40]:

$$\Delta\varphi = \arg\left[\frac{1}{M} \cdot \sum_{n=1}^{N}\sum_{m=1}^{M} \lambda_m \cdot S_m^{(1)}(TE_n) \cdot S_m^{(2)*}(TE_n)\right] \quad [40]$$

In other aspects, an approach based on using two orthogonal excitation RF pulses and Eq. [38] may also be used for mapping the B1 field from each individual channel. This is important for more accurate implementations of parallel transmission approaches.

The disclosed method was tested on phantoms and a human participant, as described in detail in the examples below.

The result (FIG. 19A-19F) obtained on a small (1.5 cm) phantom demonstrated the accuracy of the disclosed method—measurement results were practically identical with the scanner-generated RF field which had only a minor dispersion across this small phantom positioned in the center of the RF coil.

For the large phantom (FIGS. 19G-19L) and human studies (FIGS. 20A-20F), the dispersion of RF field across the field of view was, as expected, quite significant: the parameter q ranges from 0.4 to 1.2. Nevertheless, for the selected pair of the input RF pulses ($90_x$, $\pm 90_y$), the accuracy of flip angle mapping was very high and the error did not exceed 1%.

The approach described herein assumes that the system under consideration can be described in terms of a model where all compartments have the same MR frequency. This, however, does not create a problem for most biological tissues except of those composed of coexisting water and fat components. Indeed, the flip angle correction illustrated in FIG. 17 shows that frequency shifts up to about 150-200 Hz have very little effect on the flip angle quantitation. This frequency shift is much higher even than a frequency shift in water residing between lipoprotein layers in the myelin sheath in WM—about 30 Hz at 7 T MRI. The effect of inhomogeneities in MR frequencies may be more substantial within regions containing both fat and water components because the frequency shift between fat and water is about 430 Hz (at 3 T). An accurate quantification of B1 in such areas requires an approach allowing for separation of the fat/water components or suppression of one of the components. A fat-suppression RF pulse preceding the phase sensitive RF excitation pulse was used in these experiments to ameliorate this problem.

IV. SMART MRI System

Figure 13:
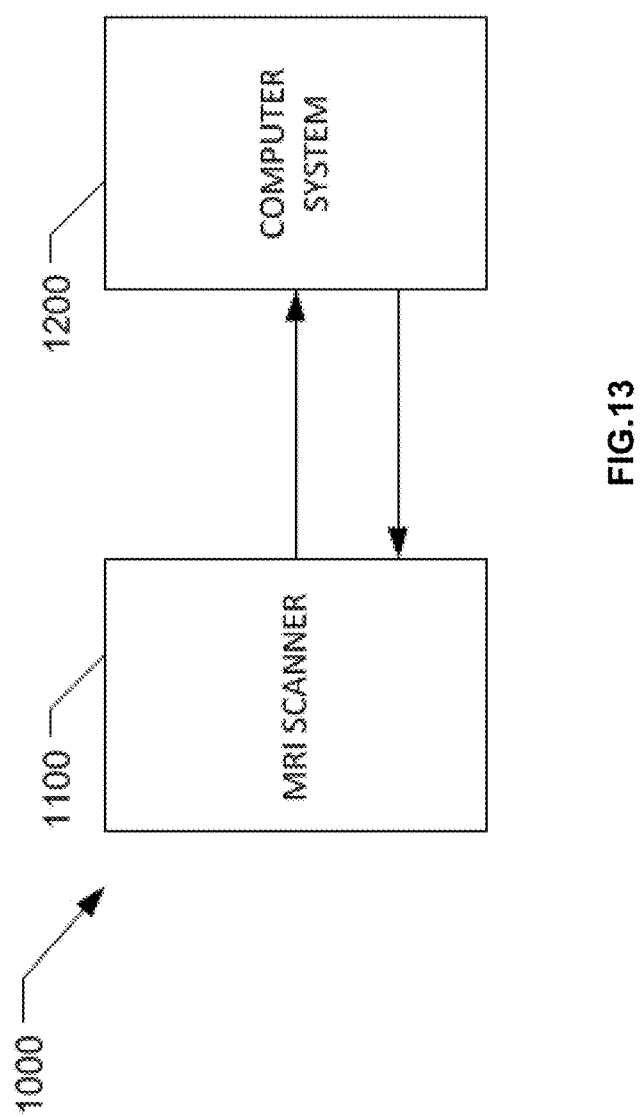
FIG. 13 is a schematic block diagram of a SMART MRI imaging system in one aspect.

In various aspects, the SMART MRI method described herein may be implemented using a SMART MRI system. FIG. 13 is an illustration of a SMART MRI imaging system 1000 in one aspect. As illustrated in FIG. 13, the SMART MRI system 1000 may include an MRI scanner 1100 operatively coupled and/or in communication with a computer system 1200. In this aspect, the computer system 1200 is configured to receive data including, but not limited to, the measured GRE data from the MRI scanner 1100, and is further configured to execute a plurality of stored executable instructions encoding one or more aspects of the SMART MRI method as described herein above. In another aspect, the computer system 1200 may be further configured to operate the MRI scanner 1100 to obtain the GRE data by executing an additional plurality of stored executable instructions.

Computer systems, as described herein, refer to any known computing device and computer system. As described herein, all such computer systems include a processor and a memory. However, any processor in a computer system referred to herein may also refer to one or more processors wherein the processor may be in one computing device or a plurality of computing devices acting in parallel. Additionally, any memory in a computer device referred to herein may also refer to one or more memories wherein the memories may be in one computing device or a plurality of computing devices acting in parallel.

The term processor, as used herein, refers to central processing units, microprocessors, microcontrollers, reduced instruction set circuits (RISC), application specific integrated circuits (ASIC), logic circuits, and any other circuit or processor capable of executing the functions described herein. The above are examples only, and are thus not intended to limit in any way the definition and/or meaning of the term "processor."

As used herein, the term "database" may refer to either a body of data, a relational database management system (RDBMS), or to both. As used herein, a database may include any collection of data including hierarchical databases, relational databases, flat file databases, object-relational databases, object oriented databases, and any other structured collection of records or data that is stored in a computer system. The above examples are example only, and thus are not intended to limit in any way the definition and/or meaning of the term database. Examples of RDBMS's include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, Calif.; IBM is a registered trademark of International Business Machines Corporation, Armonk, N.Y.; Microsoft is a registered trademark of Microsoft Corporation, Redmond, Wash.; and Sybase is a registered trademark of Sybase, Dublin, Calif.)

In one embodiment, a computer program is provided to enable the data processing of the SMART MRI method as described herein above, and this program is embodied on a computer readable medium. In an example embodiment, the computer system is executed on a single computer system, without requiring a connection to a server computer. In a further embodiment, the computer system is run in a Windows® environment (Windows is a registered trademark of Microsoft Corporation, Redmond, Wash.). In yet another embodiment, the computer system is run on a mainframe environment and a UNIX® server environment (UNIX is a registered trademark of X/Open Company Limited located in Reading, Berkshire, United Kingdom). Alternatively, the computer system is run in any suitable operating system environment. The computer program is flexible and designed to run in various different environments without compromising any major functionality. In some embodiments, the computer system includes multiple components distributed among a plurality of computing devices. One or more components may be in the form of computer-executable instructions embodied in a computer-readable medium.

The computer systems and processes are not limited to the specific embodiments described herein. In addition, components of each computer system and each process can be practiced independent and separate from other components and processes described herein. Each component and process also can be used in combination with other assembly packages and processes.

Figure 14:
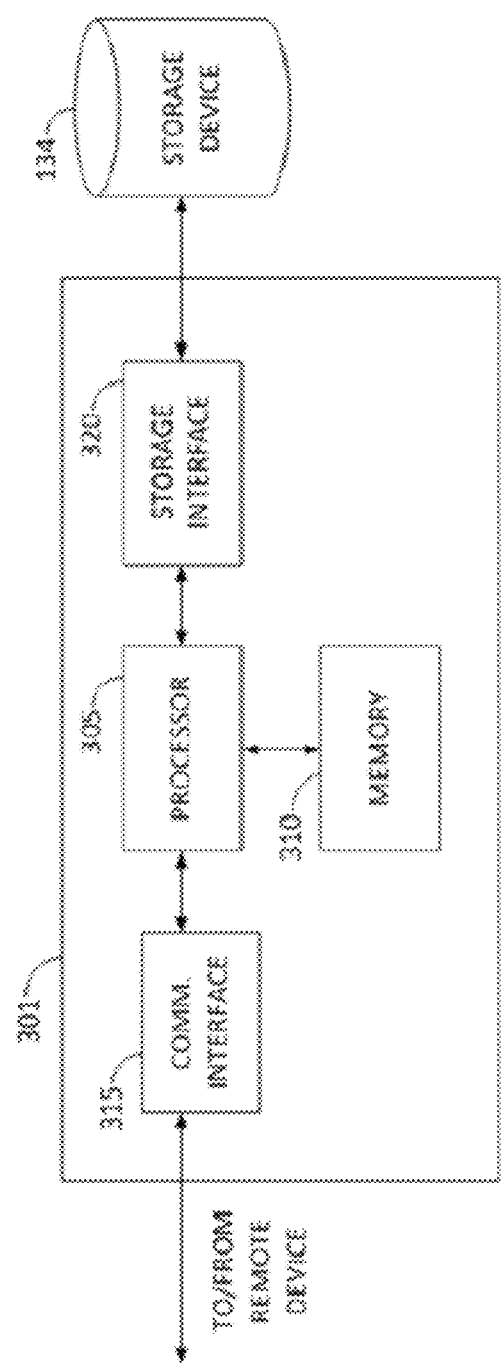
FIG. 14 is a schematic block diagram of an example server system.

In one embodiment, the computer system may be configured as a server system. FIG. 14 illustrates an example configuration of a server system 301 used to receive measurements from the MRI scanner 1100 (not illustrated). Referring again to FIG. 14, server system 301 may also include, but is not limited to, a database server. In this example embodiment, server system 301 performs all of the steps used to implement the SMART MRI imaging method as described herein above.

In this aspect, the server system 301 includes a processor 305 for executing instructions. Instructions may be stored in a memory area 310, for example. The processor 305 may include one or more processing units (e.g., in a multi-core configuration) for executing instructions. The instructions may be executed within a variety of different operating systems on the server system 301, such as UNIX, LINUX, Microsoft Windows®, etc. It should also be appreciated that upon initiation of a computer-based method, various instructions may be executed during initialization. Some operations may be required in order to perform one or more processes described herein, while other operations may be more general and/or specific to a particular programming language (e.g., C, C#, C++, Java, or any other suitable programming languages).

The processor 305 is operatively coupled to a communication interface 315 such that server system 301 is capable of communicating with a remote device such as the MRI scanner 1100, a user system, or another server system 301. For example, communication interface 315 may receive requests (e.g., requests to provide an interactive user interface to receive sensor inputs and to control one or more devices of system 1000 from a client system via the Internet.

Processor 305 may also be operatively coupled to a storage device 134. Storage device 134 is any computer-operated hardware suitable for storing and/or retrieving data. In some embodiments, storage device 134 is integrated in server system 301. For example, server system 301 may include one or more hard disk drives as storage device 134. In other embodiments, storage device 134 is external to server system 301 and may be accessed by a plurality of server systems 301. For example, storage device 134 may include multiple storage units such as hard disks or solid state disks in a redundant array of inexpensive disks (RAID) configuration. Storage device 134 may include a storage area network (SAN) and/or a network attached storage (NAS) system.

In some embodiments, processor 305 is operatively coupled to storage device 134 via a storage interface 320. Storage interface 320 is any component capable of providing processor 305 with access to storage device 134. Storage interface 320 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 305 with access to storage device 134.

Memory area 310 may include, but are not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are exemplary only, and are thus not limiting as to the types of memory usable for storage of a computer program.

Figure 15:
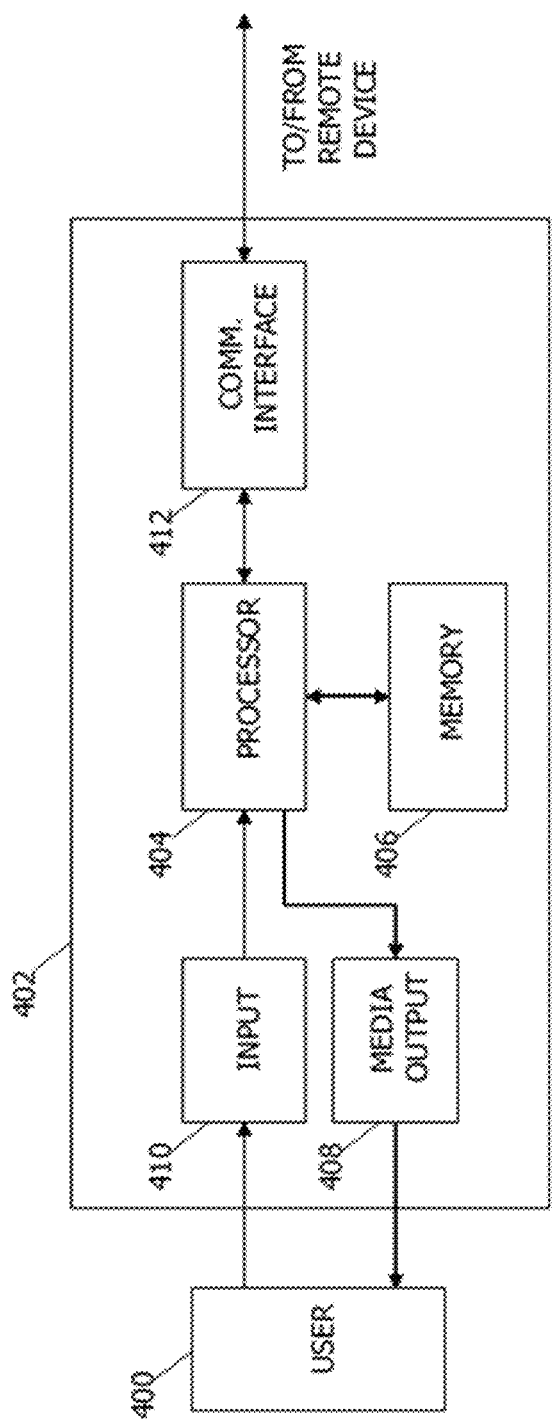
FIG. 15 is a block diagram of an example computing device.

In another embodiment, the computer system may be provided in the form of a computing device, such as a computing device 402 (shown in FIG. 15). Computing device 402 includes a processor 404 for executing instructions. In some embodiments, executable instructions are stored in a memory area 406. Processor 404 may include one or more processing units (e.g., in a multi-core configuration). Memory area 406 is any device allowing information such as executable instructions and/or other data to be stored and retrieved. Memory area 406 may include one or more computer-readable media.

In another embodiment, the memory included in the computing device 402 may include a plurality of modules. Each module may include instructions configured to execute using at least one processor. The instructions contained in the plurality of modules may implement at least part of the method for simultaneously regulating a plurality of process parameters as described herein when executed by the one or more processors of the computing device. Non-limiting examples of modules stored in the memory of the computing device include: a first module to receive measurements from one or more sensors and a second module to control one or more devices of the SMART MRI imaging system 1000.

Computing device 402 also includes one media output component 408 for presenting information to a user 400. Media output component 408 is any component capable of conveying information to user 400. In some embodiments, media output component 408 includes an output adapter such as a video adapter and/or an audio adapter. An output adapter is operatively coupled to processor 404 and is further configured to be operatively coupled to an output device such as a display device (e.g., a liquid crystal display (LCD), organic light emitting diode (OLED) display, cathode ray tube (CRT), or "electronic ink" display) or an audio output device (e.g., a speaker or headphones).

In some embodiments, client computing device 402 includes an input device 410 for receiving input from user 400. Input device 410 may include, for example, a keyboard, a pointing device, a mouse, a stylus, a touch sensitive panel (e.g., a touch pad or a touch screen), a camera, a gyroscope, an accelerometer, a position detector, and/or an audio input device. A single component such as a touch screen may function as both an output device of media output component 408 and input device 410.

Computing device 402 may also include a communication interface 412, which is configured to communicatively couple to a remote device such as server system 302 or a web server. Communication interface 412 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in memory 406 are, for example, computer-readable instructions for providing a user interface to user 400 via media output component 408 and, optionally, receiving and processing input from input device 410. A user interface may include, among other possibilities, a web browser and an application. Web browsers enable users 400 to display and interact with media and other information typically embedded on a web page or a website from a web server. An application allows users 400 to interact with a server application. The user interface, via one or both of a web browser and an application, facilitates display of information related to the process of producing a single crystal silicon ingot with low oxygen content.

EXAMPLES

The following examples demonstrate various aspects of the disclosure.

Example 1: SMART MRI Images

Three healthy subjects (HC1: age 24, HC2: age 57, and HC3: age 75) and three subjects with multiple sclerosis (MS1: age 47, MS2: age 41, and MS3: age 41) were selected for imaging. The MS patients had Secondary Progressive MS (MS1 & MS3) and Relapsing Remitting MS (MS2).

MRI data were collected for all patients using a 3 Tesla (T) Trio MRI scanner (Siemens, Erlangen, Germany) equipped with a 32-channel phased-array head coil. High resolution SMART MRI data with a voxel size of 1×1×1 mm$^3$ were acquired using a three dimensional (3D) multi-gradient-echo sequence with five flip angles of 5°, 10°, 20°, 40° and 60°. A rectangular RF pulse with 400 μs duration was used for signal excitation. For each acquisition, 3 gradient echoes were collected with echo times of 2.26 ms, 6.19 ms and 10.12 ms, respectively. A navigator echo was acquired for each phase encoding step and used to correct the artifacts caused by physiological fluctuations. By using TR=18 ms and GRAPPA with an acceleration factor (AF) of two and auto calibrating lines (ACLs) of 24 in each phase encoding direction, the acquisition time of each scan was 3 min 30 sec, and the total acquisition time was 17 min 30 sec. MPRAGE data with the same resolution were also acquired for comparison.

The under-sampled k-space data were corrected for physiological fluctuation-induced artifacts. Then, an in-house developed GRAPPA package was used to reconstruct the under sampled k-space. After applying the Fourier Transform to the reconstructed k-space, data from different channels were combined for each voxel in a single data set using the strategy expressed in Eq. [1].

The multiple datasets with multiple flip angles were analysed on a voxel-by-voxel basis using the theoretical model displayed in Eqs. [2] and [3]. The model takes into account cross-relaxation effects between "free" (intra- and extra-cellular) and "bound" (attached to macromolecules) water. By fitting the theoretical model to the multi-flip-angle data, six parameters—$S_0$, $R_1$, $k_f'$, $\lambda$, $R_2^*$, and $\Delta\omega$—were obtained.

In order to reduce noise and to enhance fitting stability, the fitting procedure was divided into several steps. The fitting procedure included fitting the model as expressed by Eqs. [2] and [3] to the collected MRI data to get an estimate for all parameters.

The parameter q used to correct for B1 field inhomogeneities was obtained in separate MR measurements described below.

The parameter λ had an estimation error that was reduced by calculating the average L-value within a spherical region surrounding each voxel with a radius of 5 mm. This radius was selected to compromise between small characteristic sizes of tissue structures (i.e. on the order of a few mm) and the need to increase SNR and thereby decrease measurement error. The resulting low-pass filtered λ maps were used to fit all other parameters in Eqs. [2] and [3].

Figure 5:
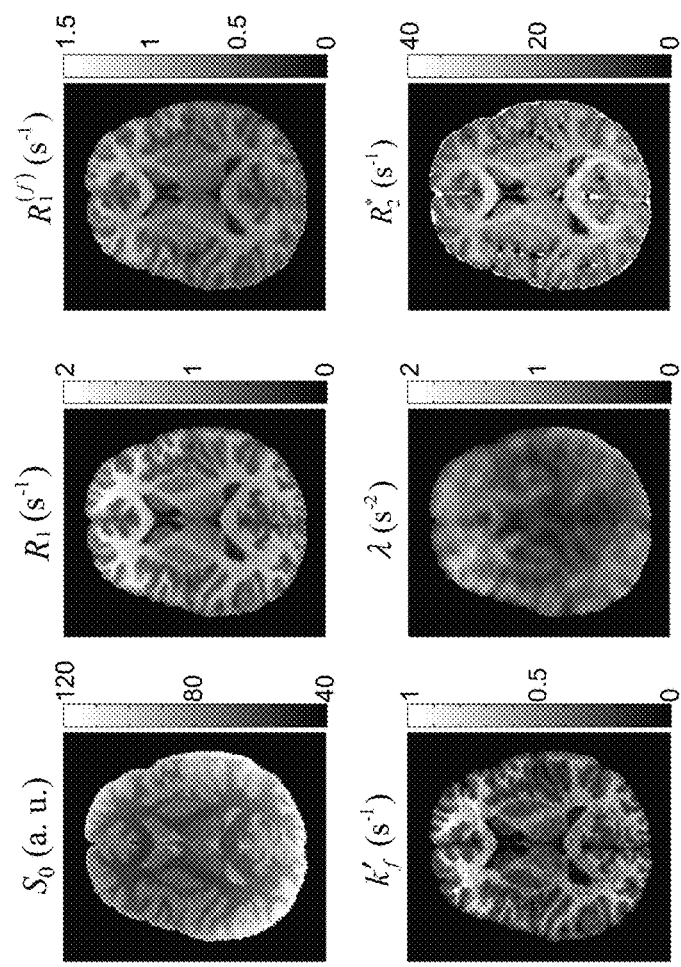
FIG. 5 contains images of SMART MRI maps of $S_0$, $R_1$, $R_1^{(f)}$, $k_f'$, $\lambda$, and $R_2^*$ from a healthy subject.

Examples of SMART MRI maps obtained from a healthy subject (HC1) are presented in FIG. 5. All the images ($S_0$, $R_1$, $R_1^{(f)}$, $k_f'$, and $R_2^*$) demonstrated clear contrast between gray matter (GM) and white matter (WM). Note that $R_2^*$ maps revealed bright WM tracts and, generally, improve the WM/GM contrast as compared to images obtained using previous methods. Because only relatively short TEs are used in the SMART MRI approach as disclosed herein, the MRI signals were highly weighted by myelin water signals.

Example 2: Comparison of SMART MRI and MPRAGE Images

MPRAGE images obtained using a previous imaging method, are often used for GM/WM segmentation. In FIGS. 6A-6H, an MPRAGE image (FIG. 6A) and SMART MRI maps of $R_1$ (FIG. 6B), $R_1^{(f)}$ (FIG. 6C), and $k_f'$ (FIG. 6D) were compared for the images obtained from healthy subject HC1. For MPRAGE, the WM and GM peak position was 315 and 200, respectively (see FIG. 6E). The ratio of the WM/GM signal intensity peak values on MPRAGE images was 1.58. The ratio of the WM/GM peak values of $R_1$ (see FIG. 6F), $R_1^{(f)}$ (see FIG. 6G), and $k_f'$ (see FIG. 6H) were 1.88, 1.51 and 2.23, respectively. This result demonstrated that $R_1^{(f)}$ resulting from SMART MRI provided similar WM/GM contrast compared with MPRAGE images, while $R_1$ and $k_f'$ maps provided stronger WM/GM contrast than MPRAGE images. Hence, the maps obtained using SMART-MRI methods may potentially be used for image segmentation.

Example 3: Imaging of MS Lesions Using SMART MRI

Figure 7:
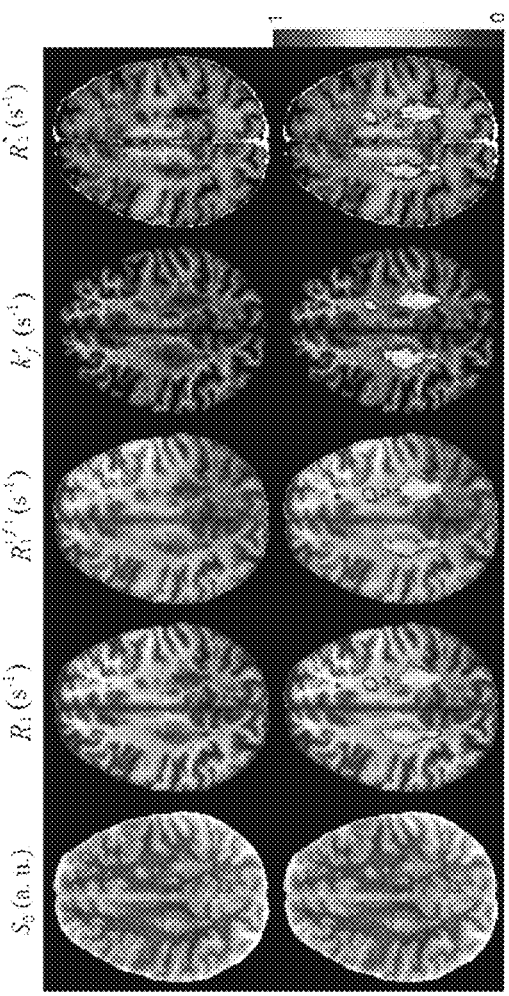
FIG. 7 contains a series of images of multi-parametric SMART MRI maps of $S_0$, $R_1$, $R_1^{(f)}$, $k_f'$ and $R_2^*$ (top row), as well the multi-parametric SMART MRI maps of $S_0$, $R_1$, $R_1^{(f)}$, $k_f'$ and $R_2^*$ superimposed with the corresponding TDS scores of an MS subject (bottom row).

Examples of $S_0$, $R_1$, $R_1^{(f)}$, $k_f'$, and $R_2^*$ maps of one MS subject (MS1) with lesions in white matter are shown in FIG. 7. Previously, to evaluate tissue damage in the lesions, Tissue Damage Score (TDS) based on GEPCI $R_2^*$ mapping was used. To calculate TDS, "normal reference" $R_2^*$ values were determined by fitting the upper half of the $R_2^*$ distribution in WM to a Gaussian function to find the position of peak center $R_{2C}^*$. Then, TDS was calculated for each pixel with a given $R_2^*$ as $TDS_{R2^*}=(R_{2C}^*-R_2^*)/R_{2C}^*$.

The TDS concept was extended to new parameters defined by SMART MRI approach:

$$TDS_R = \frac{(R_C - R)}{R_C} \quad [41]$$

where R represents any of SMART MRI quantitative relaxation parameters: $R_1$, $k_f'$, $R_1^{(f)}$ and $R_2^*$.

The second row in FIG. 7 includes SMART MRI maps with the TDS superimposed on the original maps. These TDS maps in FIG. 7 revealed similar structures but are different in details. As shown in FIG. 7, the $R_2^*$-TDS maps predicted the most severe damage in the lesion, with many of the voxels inside the lesion area having higher TDS values. In contrast, the $R_1$-TDS, $R_1^{(f)}$-TDS and $k_f'$-TDS maps exhibited similar lesion structures but with lower TDS values. However, the $k_f'$-TDS map showed the most severe damage in the left lesion. That different parametric TDS maps provide different details inside lesions indicated that different and complex biological process may occur in different parts of the lesions and these processes may differently affect different MRI relaxation parameters.

Figure 8:
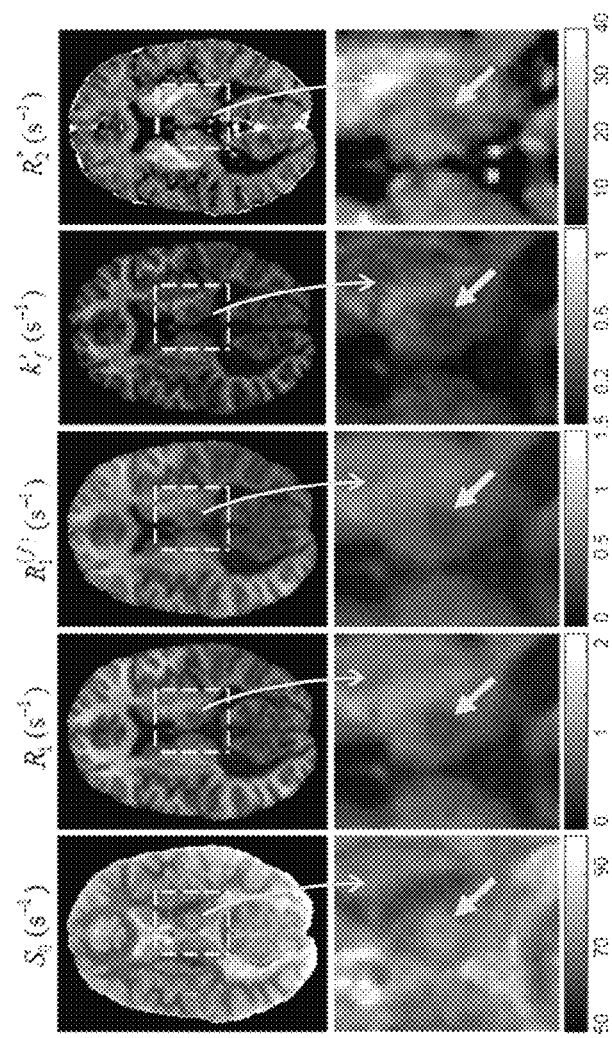
FIG. 8 contains a series of images (top row) and corresponding magnifications (bottom row) of multi-parametric SMART MRI maps of $S_0$, $R_1$, $R_1^{(f)}$, $k_f'$ and $R_2^*$ (top row) with MS lesions indicated by superimposed yellow arrows in the thalamus region of the SMART MRI magnified maps.
Figure 9:
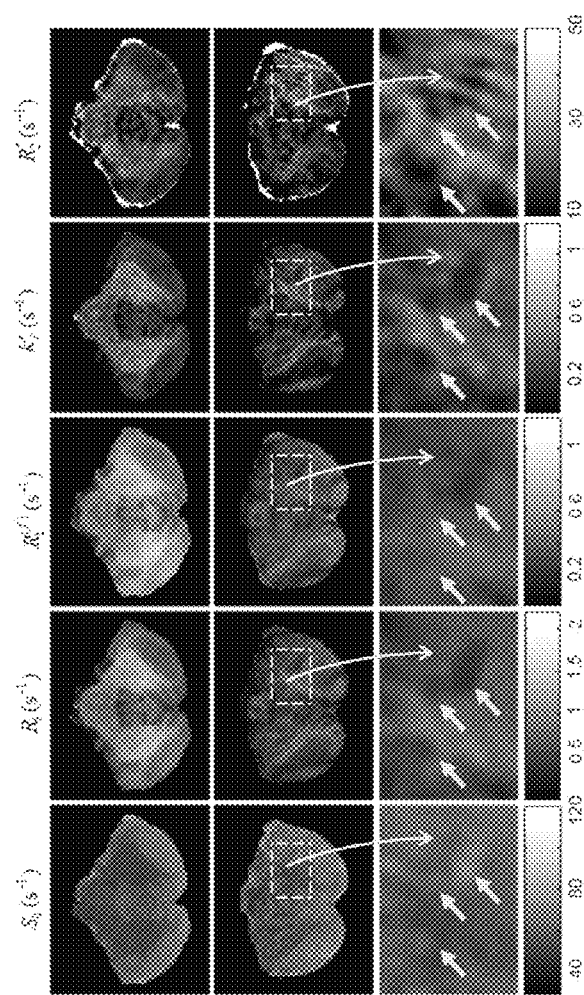
FIG. 9 is a comparison of multi-parametric SMART MRI maps of $S_0$, $R_1$, $R_1^{(f)}$, $k_f'$ and $R_2^*$ in the cerebellum region from a healthy subject (top row) and an MS subject (middle row); corresponding magnifications of the multi-parametric SMART MRI maps of the MS subject (bottom row) include a superimposed yellow arrows indicating an MS lesion.

The SMART MRI maps also revealed MS lesions in deep gray matter (FIG. 8) and cerebellum (FIG. 9). As shown in FIG. 8, the MS lesion located within the thalamus was seen on all the images. However, the details were different. The lesion was presented as a hyperintense region on the $S_0$ image, hypointense regions on the $R_1$, $R_1^{(f)}$ and $R_2^*$ maps, and appeared as a ring on the $k_f'$ map.

The cerebellum region of a healthy control (top row) and MS subjects (middle row) were compared in FIG. 9. This comparison revealed several lesions in the cerebellum cortex and white matter region in the MS subject. These lesions were most visible on $S_0$, $R_1$ and $k_f'$ maps, but were also seen on $R_1^{(f)}$ and $R_2^*$ map as well.

SMART MRI revealed heterogeneity within some lesions. For example, the MS lesion in thalamus exhibited a ring structure in the $S_0$, $R_1$, and $k_f'$ images, although this is not evident on the $R_1^{(f)}$ or $R_2^*$ maps. This ring structure likely reflected known pathologic features of some MS lesions, in which the center is often less cellular and inactive, but with disease activity at the periphery. Thus, SMART MRI provided noninvasive insights into the dynamic pathology within some lesions.

Example 4: Double RF Pulse MR Experiments for B1 Mapping

All double-RF pulse experiments were performed on a 3 T SIEMENS PRISMA® scanner. Three scans were acquired on: 1) a small spherical phantom with a diameter of 1.5 cm using a 15 channel knee coil and image resolution of 1×1×1 mm³; 2) a large spherical phantom using the body coil of the scanner and image resolution of 2×2×2 mm³; 3) a healthy volunteer using a 32 channel head coil and image resolution of 2×2×2 mm³. A 3D multi Gradient Recalled Echo (GRE) sequence with a combined non-selective RF excitation pulse consisted of a $(\alpha_x, \beta_y)$ pair was used as depicted in FIG. 18.

In these experiments, $\alpha=\beta=900$, the same pulse duration $\tau_\alpha=\tau_\beta=400$ μsec, no time gap between the RF pulses, number of echoes=6, $TE_1=2$ ms, $\Delta TE=4$ ms, and $TR=32$ ms were used. Two scans were collected with different phase for the second RF pulse: $(90°_x, 90°_y)$ and $(90°_x, -90°_y)$. A resolution of 2×2×2 mm³ and GRAPPA algorithm with an acceleration factor of 2 and autocalibrating lines of 24 in each phase encoding direction was used. Each scan on the healthy volunteer required 1 min 40 sec to cover the whole brain and the upper spinal cord. In human experiments a fat-suppression RF pulse preceding the phase-sensitive RF excitation pulse was also used to minimize effects resulting from the presence of voxels with coexisting fat and water compartments.

To demonstrate the B1 effect on R1 mapping, SMART (Simultaneous Multi-Angular Relaxometry of Tissue) MRI data with multiple flip angles of 5°, 10°, 20°, 40° and 60° was also collected. By using a high resolution of 1×1×1 mm³, TR=18 ms and GRAPPA, the total acquisition time of the SMART sequence was 17 min 30 sec. Standard MPRAGE images were also acquired for the healthy volunteers and used to generate brain segmentations using FAST tools in FSL.

A frequency ($\Delta\omega$) map was calculated by fitting the signal phase to a linear function of echo time. To get the phase difference $\Delta\varphi$, data from different channels and different scans were combined for each voxel according to Eq. [40] to remove the initial phase $\varphi_0$ in the channels and to increase the signal-to-noise ratio (SNR) in the $\Delta\varphi$ image.

The measured flip angle $\alpha_{exp\_er}$ were calculated by solving Eq. [38] using the previously-obtained results for $\Delta\omega$ and $\Delta\varphi$ on a voxel-by-voxel basis.

Example 5: MRI Imaging of Spherical Phantoms

The method described herein above was used to perform MRI imaging of two spherical water-filled phantoms of different sizes: 1.5 cm and 18 cm diameter. The results are presented in FIGS. 19A-19L. The upper row (FIGS. 19A-19F) corresponds to the smaller phantom and the lower rows (FIGS. 19G-19L) correspond to the larger phantom measurements. The B1 maps are described by the ratio, where $\alpha_0$ is the nominal (input) scanner flip angle (in these experiments, $\alpha_0=\pi/2$). The parameter q was calculated without (q', see FIG. 19D and FIG. 19J) and with (q, see FIG. 19E and FIG. 19K) accounting for the B0 field inhomogeneities described by the frequency offset $\Delta\omega$.

In the small phantom, as expected due to a rather small FOV, no significant B1 inhomogeneities were found (see FIG. 19D and FIG. 19E), and the parameter q ranged in the narrow interval from 0.95 to 1.03 (see FIG. 19F). In the larger phantom, inhomogeneity of the B1 field is more pronounced (see FIG. 19J and FIG. 19K), and the parameter q ranged from 0.4 to 1.2 (see FIG. 19L). In both the phantoms, the frequency offset $\Delta f$ across the phantoms (see FIG. 19B and FIG. 19H) was much smaller than 200 Hz and, therefore, the histograms of these parameters are practically identical, as predicted by the relationship of q with respect to frequency shift illustrated in FIG. 17.

Example 6: Effect of B1 Correction on SMART MRI Brain Images

The method described herein above was used to perform MRI imaging of a healthy human subject. The maps of the parameters obtained from a healthy volunteer are shown in FIGS. 20A-20F. Similar to the phantom results, as the frequency offset $\Delta f$ (FIG. 20B) is smaller than 200 Hz in all parts of the brain, the parameters q' (FIG. 20D) and q (FIG. 20E), and their histograms (FIG. 20F) are practically identical.

Figure 21:
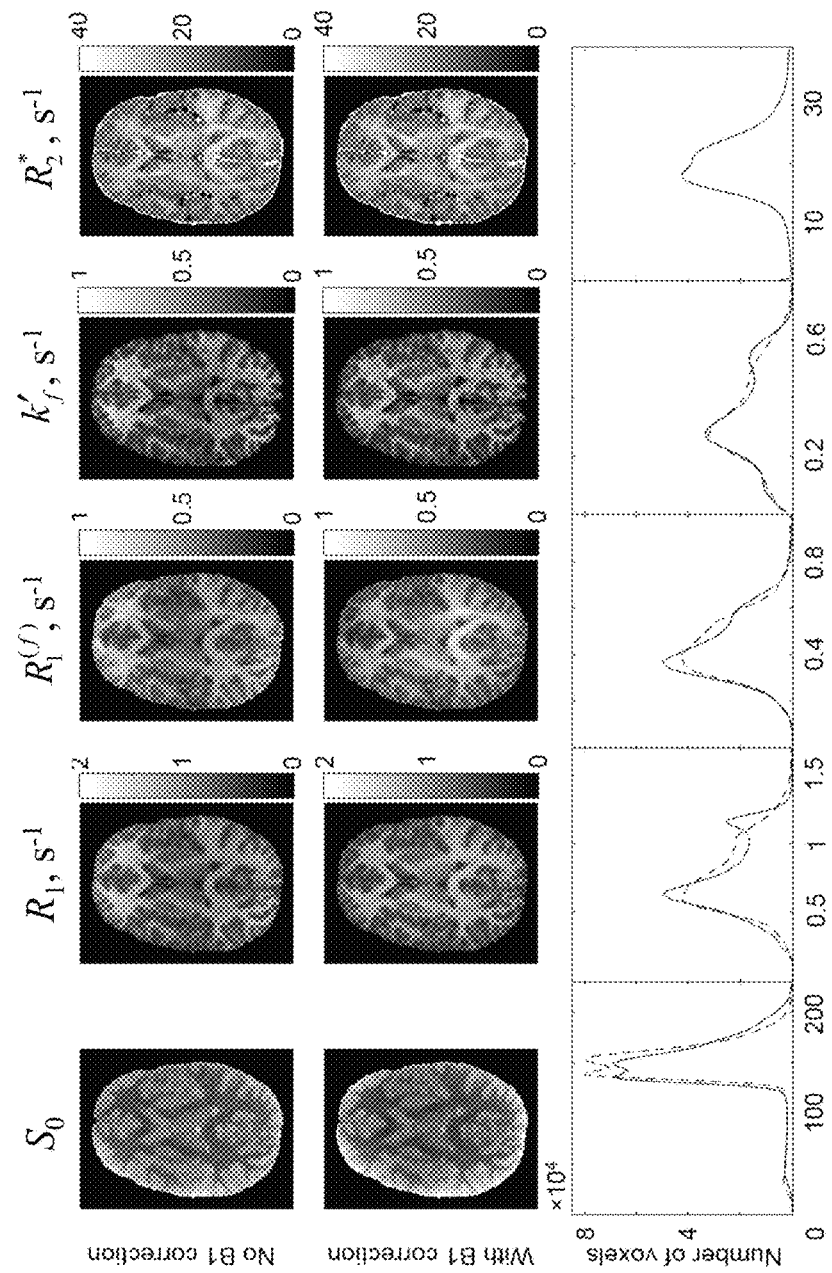
FIG. 21 contains a series of SMART MRI maps of the parameters $S_0$, $R_1$, $R_1^{(f)}$, $k_f'$ and $R_2^*$ obtained without B1 correction (top row) and with B1 correction (middle row), as well as histograms of each corresponding parameter obtained without B1 correction (dashed lines) and with B1 correction (solid lines).

The maps of the SMART parameters $R_1$, $R_1^{(f)}$, and $k_f'$ before (top row) and after (middle row) the B1 correction are compared in FIG. 21. FIG. 21 exhibited substantial differences in $R_1$, $R_1^{(f)}$ values after applying the B1 correction. In contrast, the $k_f'$ map was less affected. The histograms in FIG. 21 (bottom row) demonstrated that after the B1 correction, the WM and GM peaks were more separated, which indicated that $R_1$ and $R_1^{(f)}$ after the B1 correction provided better WM-GM contrast.

The mean values of $R_1$, $R_1^{(f)}$, and $k_f'$ in white matter (WM) and cortical gray matter (GM) are summarized in Table 1.

TABLE 1

Comparison of SMART parameters before and after the B1 correction

| | | no B1 correction | with B1 correction |
|---|---|---|---|
| $R_1$, s$^{-1}$ | white matter | 0.99 | 1.02 |
| | cortical gray matter | 0.69 | 0.65 |
| $R_1^{(f)}$, s$^{-1}$ | white matter | 0.52 | 0.54 |
| | cortical gray matter | 0.41 | 0.37 |

TABLE 1-continued

Comparison of SMART parameters before and after the B1 correction

| | | no B1 correction | with B1 correction |
|---|---|---|---|
| $k_f'$, s$^{-1}$ | white matter | 0.47 | 0.48 |
| | cortical gray matter | 0.28 | 0.28 |

According to FIG. 21 and Table 1, the B1 correction of the flip angles (i.e. accounting for the deviation of the actual flip angles from their input scanner values) changed the average values of the SMART parameters (up to 10%) and also provided stronger WM-GM contrast.

The examples provided herein are included to demonstrate preferred embodiments of the invention. It should be appreciated by those of skill in the art that the techniques disclosed in the examples that follow represent techniques discovered by the inventors to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of performing quantitative MM imaging of a subject, the method comprising:
   acquiring a plurality of MR data using an RF coil from the subject using a GRE sequence with a series of read-out gradient pulses with a plurality of flip angles;
   combining a plurality of MRI image datasets obtained from the subject to form a single dataset, each MRI image dataset comprising a plurality of imaging voxels and an image value set associated with each imaging voxel, each image value set comprising multiple image values, each image value reconstructed from k-space MRI data obtained from one RF channel of the RF coil at one combination of read-out gradient pulse and flip angle of the GRE sequence;
   fitting a theoretical model $S(\alpha, TR, TE)$ to each image value set associated with each imaging voxel of the single dataset, the theoretical model $S(\alpha, TR, TE)$ characterized by five quantitative tissue-specific MRI parameters, the quantitative tissue-specific MM parameters comprising: $S_0$ representing a spin density, $R_1$ representing a longitudinal relaxation rate constant, $R_2^*$; representing a transverse relaxation rate constant, $k_f'$ representing a cross-relaxation rate constant, and $\lambda$ representing a magnetization transfer-related relaxation parameter, wherein $\alpha$ is a flip angle, TR is a repetition time, and TE is a gradient echo time of the GRE sequence; and
   producing at least one quantitative image (map) comprising each imaging voxel and at least one corresponding value of $S_0$, $R_1$, $R_2^*$, $k_f'$ and $\lambda$ determined from fitting the theoretical model $S(\alpha, TR, TE)$.

2. The method of claim 1, wherein combining the plurality of MRI image datasets comprises summing M GRE signals $S_m$ obtained by M RF channels for each imaging voxel according to the relation:

$$S(TE) = \frac{1}{M} \cdot \sum_{m=1}^{M} \eta_m \cdot S^*(TE_1) \cdot S_m(TE),$$

wherein:

$$\eta_m = \frac{1}{M\sigma_m^2} \cdot \sum_{i=1}^{M} \sigma_i^2,$$

$S^*$ is a complex conjugate of S, $\eta_m$ is a weighting factor, and $\sigma_m$ is an r.m.s. noise amplitude.

3. The method of claim 1, wherein the theoretical model $S(\alpha, TR, TE)$ further comprises:

$$S(\alpha, TR, TE) = S_0 \cdot \Psi(\alpha, TR) \cdot \exp(-R_2^* \cdot TE) \cdot \exp(i\Delta\omega \cdot TE) \cdot F(TE)$$

wherein:

$$\Psi(\alpha, TR) = \frac{(1-E) - k_f' \cdot TR \cdot \frac{(\alpha q)^2}{\lambda \cdot (v \cdot \tau \cdot TR) + (\alpha q)^2}}{1 - E \cdot \cos(\alpha q)} \cdot \sin(\alpha q),$$

$$E = \exp(-R_1 \cdot TR),$$

$$\lambda = R_2^{(b)} \cdot \left(R_1^{(b)} + k_b\right), R_1 = R_1^{(f)} + k_f', k_f' = k_f \cdot \left(1 + k_b/R_1^{(b)}\right)^{-1},$$

$\Delta\omega$ is a frequency shift, F(TE) is a correction factor for B0 macroscopic field inhomogeneities, and q is a correction factor for B1 radio frequency transmitter field inhomogeneities.

4. The method of claim 3, wherein F(TE) is obtained using a voxel spread function approach.

5. The method of claim 3, wherein the theoretical model $S(\alpha, TR, TE)$ is further characterized by q, and q is determined during fitting the theoretical model $S(\alpha, TR, TE)$ to each image value set associated with each imaging voxel of the single dataset.

6. The method of claim 5, wherein each value of q at each imaging voxel is corrected by averaging the q values within a surrounding region determined for each imaging voxel.

7. The method of claim 3, wherein q is determined by:
   obtaining a first plurality of MR signals produced in response to a first pair of successive and orthogonal excitation RF pulses comprising a first initial excitation RF pulse with a first initial flip angle $\alpha$ and a first final excitation RF pulse produced orthogonal to the first initial excitation RF pulse with a first final flip angle $\beta$;
   obtaining a second plurality of MR signals produced in response to a second pair of successive and orthogonal excitation RF pulses comprising a second initial excitation RF pulse with a second initial flip angle $\alpha$ and a second final excitation RF pulse produced orthogonal to the second initial excitation RF pulse excitation with a second final flip angle $-\beta$; and
   obtaining a phase difference $\Delta\varphi$ between each portion of the first and second plurality of MR signals corresponding to each imaging voxel according to the relation:

$$\Delta\varphi = \arg\left[\frac{1}{M} \cdot \sum_{n=1}^{N}\sum_{m=1}^{M} \lambda_m \cdot S_m^{(1)}(TE_n) \cdot S_m^{(2)*}(TE_n)\right],$$

wherein:
M is the number of RF channels of an RF coil used to obtain the first and second plurality of MR signals, N is the number of echo times, $S_m^{(1)}$ is an MR signal from the portion of the first plurality of MR signals, and $S_m^{(2)*}$ is a complex conjugate of the portion of the second plurality of MR signals; and obtaining q from the relationship:

$$\tan(\Delta\varphi) = $$

$$\left\{2\alpha\cdot\beta\cdot(p^2+\alpha^2\cdot\cos\Omega_\alpha)\cdot\left[4p^2\cdot\Omega_\beta^2\cdot\cos\Omega_\beta\cdot\sin^2\!\left(\frac{\Omega_\alpha}{2}\right)\cdot\sin^2\!\left(\frac{\Omega_\beta}{2}\right)+\right.\right.$$
$$\left.+\Omega_\alpha\Omega_\beta^3\cdot\sin\Omega_\alpha\cdot\sin\Omega_\beta-2p^2\cdot\Omega_\beta^2\cdot\sin^2\!\left(\frac{\Omega_\alpha}{2}\right)\cdot\sin^2\Omega_\beta\right]\right\}\Big/$$
$$\left\{p^6\cdot\beta^2-\alpha^2\cdot\beta^4\cdot\Omega_\alpha^2\cdot\sin^2\Omega_\alpha-\right.$$
$$2\cdot p^2\cdot\beta^2\cdot\cos\Omega_\beta\cdot(p^4+\alpha^2\cdot\Omega_\alpha^2\cdot\sin^2\Omega_\alpha)-$$
$$\cos^2\Omega_B\cdot\left[-p^6\cdot\beta^2+p^2\cdot\alpha^2\cdot\left(4\cdot\Omega_\beta^4\cdot\sin^4\!\left(\frac{\Omega_\alpha}{2}\right)+\right.\right.$$
$$p^2\cdot\Omega_\alpha^2\cdot\sin^2\Omega_\alpha\Big)\Big]+8\cdot p^2\cdot\alpha^2\cdot\beta^2\cdot\cdot$$
$$\Omega_\alpha\Omega_\beta\cdot\sin^2\!\left(\frac{\Omega_\alpha}{2}\right)\sin^2\!\left(\frac{\Omega_\beta}{2}\right)\cdot\sin\Omega_\alpha\cdot\sin\Omega_\beta-$$
$$p^2\cdot\Omega_\beta^2\cdot(p^2\cdot(\alpha^2-\beta^2)+\alpha^2\cdot\Omega_\alpha^2\cdot\sin^2$$
$$\Omega_\alpha)\cdot\sin^2\Omega_\beta++2\cdot p^2\cdot\alpha^2\cdot\cos\Omega_\alpha\cdot$$
$$\left[4p^2\cdot\beta^2\cdot\sin^4\!\left(\frac{\Omega_\beta}{2}\right)+\Omega_\beta^4\cdot\sin^2\Omega_\beta\right]+$$
$$+\alpha^2\cdot\cos^2\Omega_\alpha\cdot\left[4p^2\cdot\alpha^2\cdot\beta^2\cdot\sin^4\right.$$
$$\left.\left.\left(\frac{\Omega_\beta}{2}\right)+(\alpha^2\beta^2-p^4)\cdot\Omega_\beta^2\cdot\sin^2\Omega_\beta\right]\right\}$$

wherein $\alpha$ is a flip angle of a first excitation RF pulse corresponding to the first plurality of MR signals, $\beta$ is a flip angle of a second excitation RF pulse corresponding to the second plurality of MR signals, $p=\Delta\omega\cdot\tau$, $\Omega\alpha=((\alpha q)^2+p^2)^{1/2}$, $\Omega\beta=((\beta q)^2+p^2)^{1/2}$.

8. The method of claim 7, wherein $\alpha=\beta$ and the method further comprises obtaining q from the relationship $$\Delta\varphi = \arctan\left[\frac{2\Omega^2\cdot(p^2+(\alpha q)^2\cos\Omega)}{(\alpha q)^2\cdot(1-\cos\Omega)\cdot((\alpha q)^2+(p^2+\Omega^2)\cdot\cos\Omega)}\right]$$

wherein $\Omega=((\alpha q)^2+p^2)^{1/2}$.

9. The method of claim 1, further comprising calculating a Tissue Damage Score (TDS) for each imaging voxel according to
   $TDS_R=(R_C-R)/R_C$
wherein $R_c$ is a position of a peak center in a Gaussian distribution of one of the five quantitative tissue-specific MRI parameters associated with a substructure within a tissue of the subject, and R is a value of the one quantitative tissue-specific MM parameter at each imaging voxel.

10. The method of claim 1, wherein an MM image dataset is acquired independently at each different flip angle and all MRI image datasets are combined to produce the single dataset.

11. The method of claim 1, wherein each MM image dataset acquires all flip angles in an interleaved manner at each phase encoding step.

12. The method of claim 1, further comprising acquiring the k-space MM data from a plurality of RF channels using a Gradient Recalled Echo (GRE) sequence, the GRE sequence comprising multiple gradient echoes and multiple flip angles.

13. The method of claim 12, further comprising removing an artifact associated with physiological fluctuations of the subject during acquisition of the k-space MRI data.

14. A method of mapping a B1 radio-frequency field within a region of interest of an MM scanning device, the method comprising:
   obtaining a first plurality of MR signals produced in response to a first pair of successive and orthogonal excitation RF pulses comprising a first initial excitation RF pulse with a first initial flip angle $\alpha$ and a first final excitation RF pulse produced orthogonal to the first initial excitation RF pulse with a first final flip angle $\beta$;
   obtaining a second plurality of MR signals produced in response to a second pair of successive and orthogonal excitation RF pulses comprising a second initial excitation RF pulse with a second initial flip angle $\alpha$ and a second final excitation RF pulse produced orthogonal to the second initial excitation RF pulse excitation with a second final flip angle $-\beta$; and
   analyzing the first and second plurality of MR signals to obtain a map of a B1-encoded MR signal phase and a B0-dependent signal frequency.

15. The method of claim 14, wherein analyzing the first and second plurality of MR signals comprises:
   obtaining a phase difference $\Delta\varphi$ between each portion of the first and second plurality of MR signals corresponding to each imaging voxel according to the relation:

$$\Delta\varphi = \arg\left[\frac{1}{M}\cdot\sum_{n=1}^{N}\sum_{m=1}^{M}\lambda_m\cdot S_m^{(1)}(TE_n)\cdot S_m^{(2)*}(TE_n)\right],$$

wherein:
M is the number of RF channels of an RF coil used to obtain the first and second plurality of MR signals, N is the number of echo times, $S_m^{(i)}$ is an MR signal from the portion of the first plurality of MR signals, and $S_m^{(2)*}$ is a complex conjugate of the portion of the second plurality of MR signals; and
   obtaining q from the relationship:

$$\tan(\Delta\varphi) = $$

$$\left\{2\alpha\cdot\beta\cdot(p^2+\alpha^2\cdot\cos\Omega_\alpha)\cdot\left[4p^2\cdot\Omega_\beta^2\cdot\cos\Omega_\beta\cdot\sin^2\!\left(\frac{\Omega_\alpha}{2}\right)\cdot\sin^2\!\left(\frac{\Omega_\beta}{2}\right)+\right.\right.$$
$$\left.+\Omega_\alpha\Omega_\beta^3\cdot\sin\Omega_\alpha\cdot\sin\Omega_\beta-2p^2\cdot\Omega_\beta^2\cdot\sin^2\!\left(\frac{\Omega_\alpha}{2}\right)\cdot\sin^2\Omega_\beta\right]\right\}\Big/$$
$$\left\{p^6\cdot\beta^2-\alpha^2\cdot\beta^4\cdot\Omega_\alpha^2\cdot\sin^2\Omega_\alpha-2\cdot p^2\cdot\beta^2\cdot\right.$$
$$\cos\Omega_\beta\cdot(p^4+\alpha^2\cdot\Omega_\alpha^2\cdot\sin^2\Omega_\alpha)-\cos^2\Omega_\beta\cdot\left[-p^6\cdot\beta^2+p^2\cdot\right.$$
$$\alpha^2\cdot\left(4\cdot\Omega_\beta^4\cdot\sin^4\!\left(\frac{\Omega_\alpha}{2}\right)+p^2\cdot\Omega_\alpha^2\cdot\sin^2\Omega_\alpha\right)\right]+$$
$$8\cdot p^2\cdot\alpha^2\cdot\beta^2\cdot\cdot\Omega_\alpha\Omega_\beta\cdot\sin^2\!\left(\frac{\Omega_\alpha}{2}\right)\sin^2\!\left(\frac{\Omega_\beta}{2}\right)\cdot\sin$$

-continued $$\Omega_\alpha \cdot \sin\Omega_\beta - -p^2 \cdot \Omega_\beta^2 \cdot (p^2 \cdot (\alpha^2 - \beta^2) + \alpha^2 \cdot$$

$$\Omega_\alpha^2 \cdot \sin^2\Omega_\alpha) \cdot \sin^2\Omega_\beta + +2 \cdot p^2 \cdot \alpha^2 \cdot \cos$$

$$\Omega_\alpha \cdot \left[ 4p^2 \cdot \beta^2 \cdot \sin^4\left(\frac{\Omega_\beta}{2}\right) + \Omega_\beta^4 \cdot \sin^2\Omega_\beta \right] + +$$

$$\alpha^2 \cdot \cos^2\Omega_\alpha \cdot \left[ 4p^2 \cdot \alpha^2 \cdot \beta^2 \cdot \sin^4\left(\frac{\Omega_\beta}{2}\right) + \right.$$

$$\left. (\alpha^2\beta^2 - p^4) \cdot \Omega_\beta^2 \cdot \sin^2\Omega_\beta \right] \}$$

wherein $\alpha$ is a flip angle of a first excitation RF pulse corresponding to the first plurality of MR signals, $\beta$ is a flip angle of a second excitation RF pulse corresponding to the second plurality of MR signals, $p=\Delta\omega\cdot\tau$, $\Omega\alpha=((\alpha q)^2+p^2)^{1/2}$, $\Omega\beta=((\beta q)^2+p^2)^{1/2}$, and q represents inhomogeneities in a B1 radio frequency transmitter field.

16. The method of claim 15, wherein $\alpha=\beta$ and the method further comprises obtaining q from the relationship $$\Delta\varphi = \arctan\left[ \frac{2\Omega^2 \cdot (p^2 + (\alpha q)^2 \cos\Omega)}{(\alpha q)^2 \cdot (1 - \cos\Omega) \cdot ((\alpha q)^2 + (p^2 + \Omega^2) \cdot \cos\Omega)} \right]$$

wherein $\Omega=((\alpha q)^2 p^2)^{1/2}$.

17. A method of performing quantitative MM imaging of a subject, the method comprising:

acquiring a plurality of MR data using an RF coil from the subject using a GRE sequence with a series of read-out gradient pulses with a plurality of flip angles;

combining a plurality of MRI image datasets obtained from the subject to form a single dataset, each MM image dataset comprising a plurality of imaging voxels and an image value set associated with each imaging voxel, each image value set comprising multiple image values, each image value reconstructed from k-space Mill data obtained from one RF channel of the RF coil at one combination of read-out gradient pulse and flip angle of the GRE sequence;

fitting a theoretical model S($\alpha$, TR, TE) to each image value set associated with each imaging voxel of the single dataset, the theoretical model S($\alpha$, TR, TE) characterized by five quantitative tissue-specific MM parameters, the quantitative tissue-specific MM parameters comprising: $S_0$ representing a spin density, $R_1$ representing a longitudinal relaxation rate constant, $R_2$* representing a transverse relaxation rate constant, $k_f^t$ representing a cross-relaxation rate constant, and $\lambda$ representing a magnetization transfer-related relaxation parameter, and an additional parameter q representing inhomogeneities in a B1 radio frequency transmitter field wherein $\alpha$ is a flip angle, TR is a repetition time, and TE is a gradient echo time of the GRE sequence; and producing at least one quantitative image (map) comprising each imaging voxel and at least one corresponding value of $S_0$, $R_1$, $R_2$*, $k_f^t$ and $\lambda$ determined from fitting the theoretical model S($\alpha$, TR, TE).

18. The method of claim 17, wherein combining the plurality of MRI image datasets comprises summing M GRE signals $S_m$ obtained by M RF channels for each imaging voxel according to the relation:

$$S(TE) = \frac{1}{M} \cdot \sum_{m=1}^{M} \eta_m \cdot S^*(TE_1) \cdot S_m(TE),$$

wherein:

$$\eta_m = \frac{1}{M\sigma_m^2} \cdot \sum_{i=1}^{M} \sigma_i^2,$$

S* is a complex conjugate of 5, $\eta_m$ is a weighting factor, and $\sigma_m$ is an r.m.s. noise amplitude.

* * * * *